US006776347B2

(12) United States Patent
Nishikawa et al.

(10) Patent No.: US 6,776,347 B2
(45) Date of Patent: Aug. 17, 2004

(54) SHEET-FRAMED IC CARRIER, METHOD FOR PRODUCING THE SAME, AND IC CARRIER CASE

(75) Inventors: Seiichi Nishikawa, Tokyo (JP); Hiroshi Harima, Tokyo (JP); Kazuyoshi Irisawa, Tokyo (JP); Jun Takahashi, Tokyo (JP); Akiko Moriyama, Tokyo (JP); Mayumi Inada, Tokyo (JP); Yoshikazu Fukushima, Tokyo (JP); Masaki Wakamatsu, Tokyo (JP)

(73) Assignee: Dai Nippon Printing Co., Ltd. (JP)

( * ) Notice: Subject to any disclaimer, the term of this patent is extended or adjusted under 35 U.S.C. 154(b) by 283 days.

(21) Appl. No.: 10/032,496

(22) Filed: Jan. 2, 2002

(65) Prior Publication Data

US 2002/0050527 A1 May 2, 2002

Related U.S. Application Data

(62) Division of application No. 08/961,501, filed on Oct. 30, 1997, now Pat. No. 6,398,114, which is a division of application No. 08/699,034, filed on Aug. 19, 1996, now Pat. No. 5,757,116, which is a division of application No. 08/283,292, filed on Jul. 28, 1994, now Pat. No. 5,581,065.

(30) Foreign Application Priority Data

| Aug. 2, 1993 | (JP) | 5-209908 |
| Oct. 29, 1993 | (JP) | 5-294790 |
| Nov. 1, 1993 | (JP) | 5-296135 |
| Nov. 1, 1993 | (JP) | 5-296136 |
| Nov. 1, 1993 | (JP) | 5-296137 |
| Nov. 1, 1993 | (JP) | 5-296138 |
| Dec. 3, 1993 | (JP) | 5-339330 |
| Dec. 14, 1993 | (JP) | 5-342627 |
| Dec. 14, 1993 | (JP) | 5-342628 |
| Feb. 18, 1994 | (JP) | 6-21171 |

(51) Int. Cl.[7] .............................................. G06K 15/00
(52) U.S. Cl. ................................... 235/492; 235/487
(58) Field of Search .................................... 235/487, 492, 235/489; 156/250

(56) References Cited

U.S. PATENT DOCUMENTS

| 3,308,989 A | 3/1967 | Alltop et al. |
| 4,417,413 A | 11/1983 | Hoppe et al. ............... 235/488 |
| 4,443,027 A | 4/1984 | McNeely et al. ............ 283/83 |
| 4,457,798 A * | 7/1984 | Hoppe et al. ............... 156/248 |
| 4,639,585 A | 1/1987 | Hagiri-Tehrani et al. ... 235/487 |
| 4,891,013 A | 1/1990 | Komaki ....................... 439/91 |
| 5,184,259 A | 2/1993 | Kodai et al. ................ 235/492 |
| 5,208,450 A * | 5/1993 | Uenishi et al. ............. 235/492 |
| 5,362,955 A | 11/1994 | Haghiri-Tehrani et al. .. 235/492 |
| 5,410,136 A | 4/1995 | McIntire et al. ............ 235/380 |
| 5,514,862 A | 5/1996 | Salzano ...................... 235/487 |
| 5,677,524 A * | 10/1997 | Haghiri-Tehrani .......... 235/492 |

FOREIGN PATENT DOCUMENTS

| DE | 4132720 | 4/1993 |
| EP | 0163880 | 11/1985 |
| EP | 453737 | 10/1991 |
| EP | 521778 | 1/1993 |
| EP | 0521778 | 1/1993 |
| EP | 535436 | 4/1993 |
| EP | 0 535 436 A2 | 4/1993 |
| EP | 0535436 | 4/1993 |

(List continued on next page.)

*Primary Examiner*—Mark Tremblay
(74) *Attorney, Agent, or Firm*—Parkhurst & Wendel, L.L.P.

(57) ABSTRACT

A sheet-framed IC carrier has a sheet frame having an aperature, and a backing film with a pressure-sensitive adhesive layer on one surface thereof which is adhered to the back surface of the sheet frame. An IC carrier having an IC module is secured in the aperature of the sheet frame with the adhesive layer on the backing film. When the IC carrier is removed from the sheet-framed IC carrier, no excessive load is exerted on the IC module and no projection remains on the peripheral edge of the carrier base.

13 Claims, 31 Drawing Sheets

FOREIGN PATENT DOCUMENTS

| | | |
|---|---|---|
| FR | 2622323 | 4/1989 |
| FR | 2 662 323 | 4/1989 |
| FR | 2678753 | 1/1993 |
| GB | 336377 | 10/1930 |
| GB | 2100669 | 1/1983 |
| JP | 6-24188 | 2/1994 |
| JP | 6-199082 | 7/1994 |
| WO | WO 9308714 | 5/1993 |

* cited by examiner

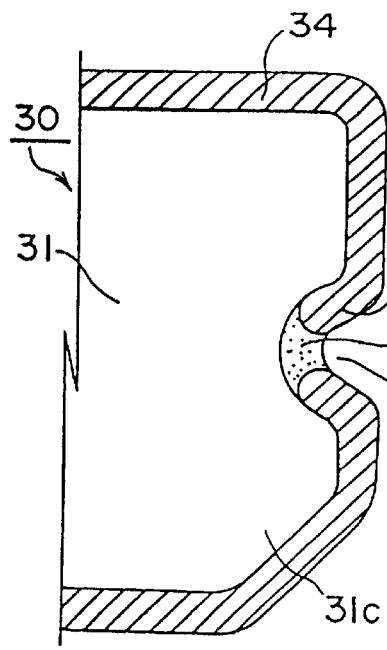
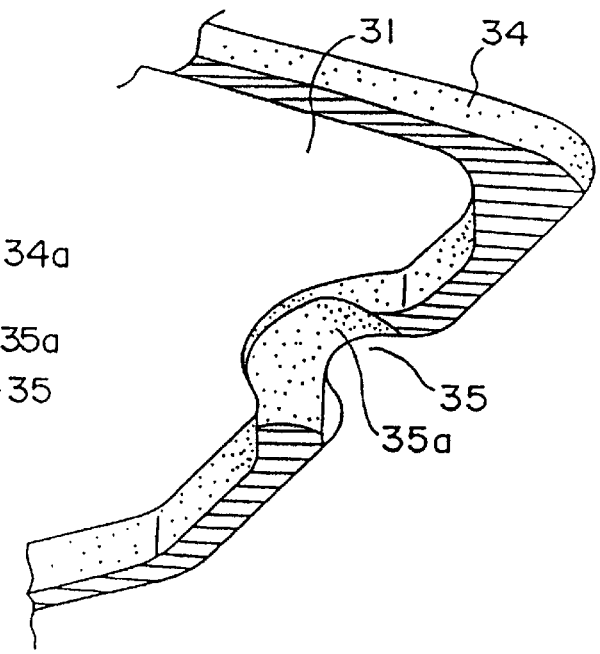
FIG. 5A  FIG. 5B
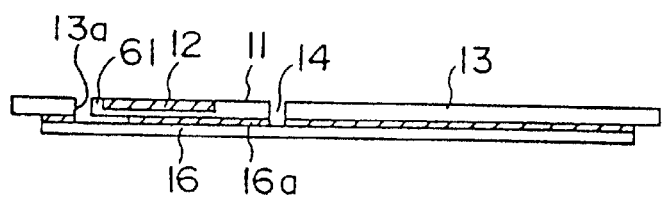
FIG. 6
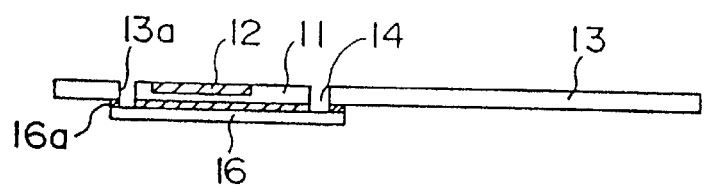
FIG. 7

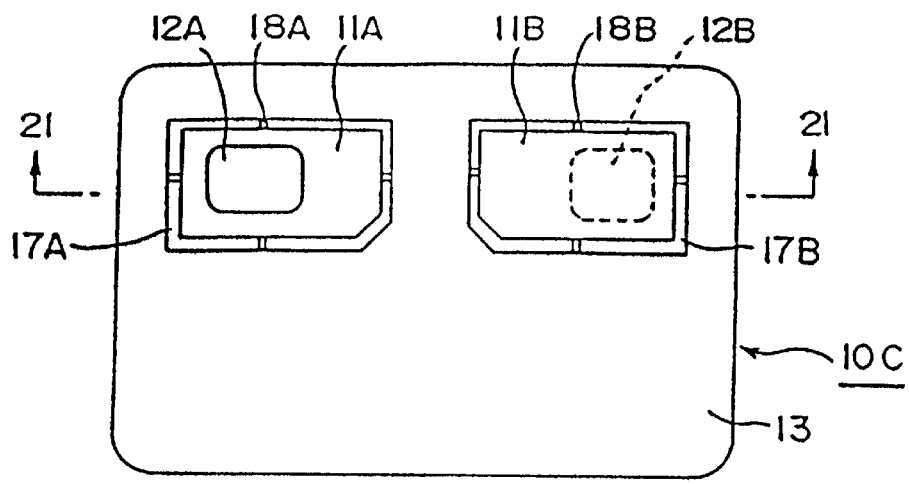
FIG. 21A
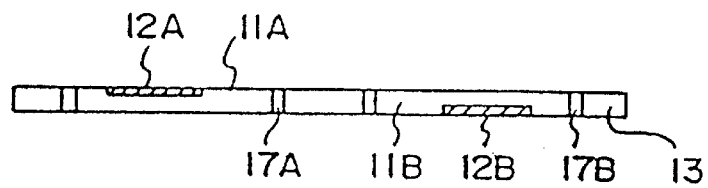
FIG. 21B
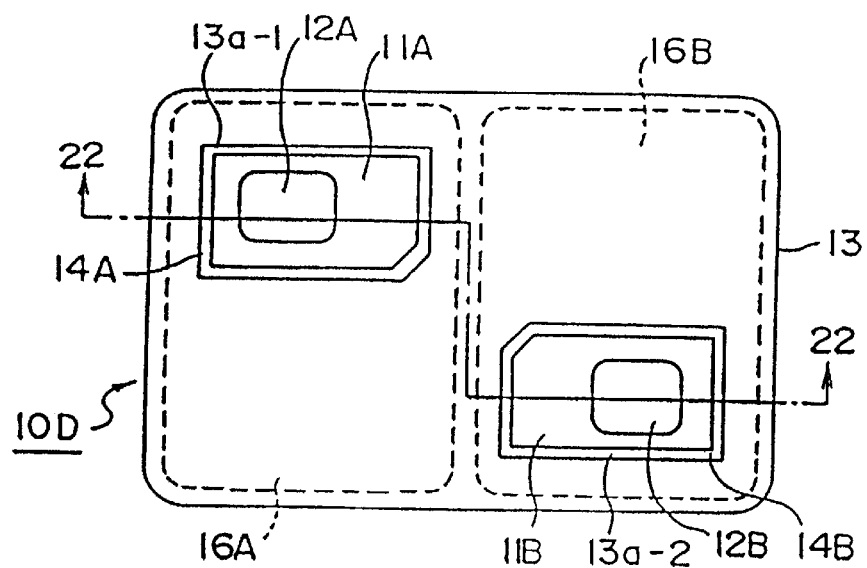
FIG. 22A
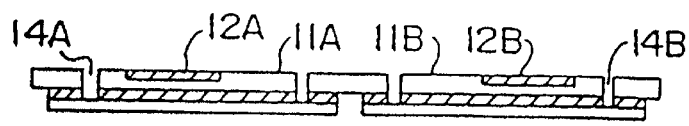

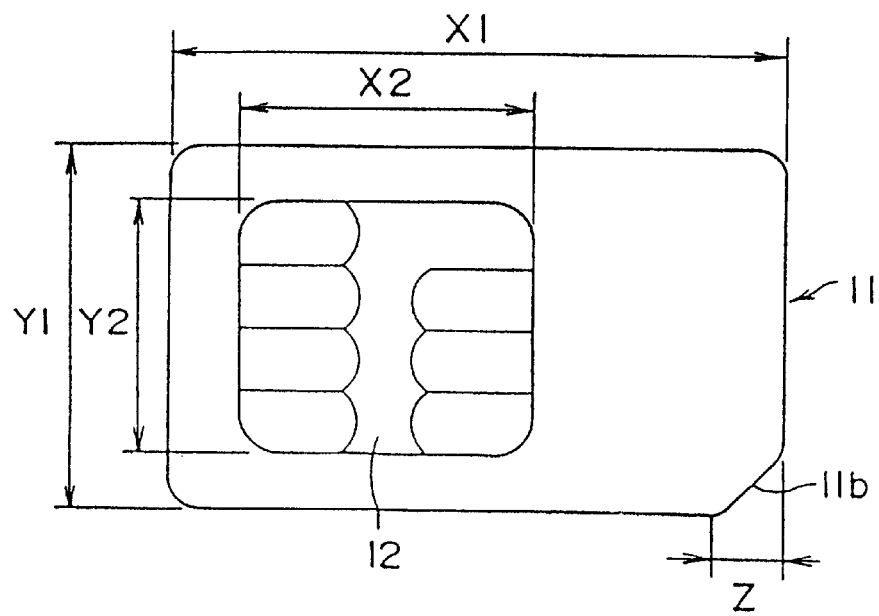
F I G. 37
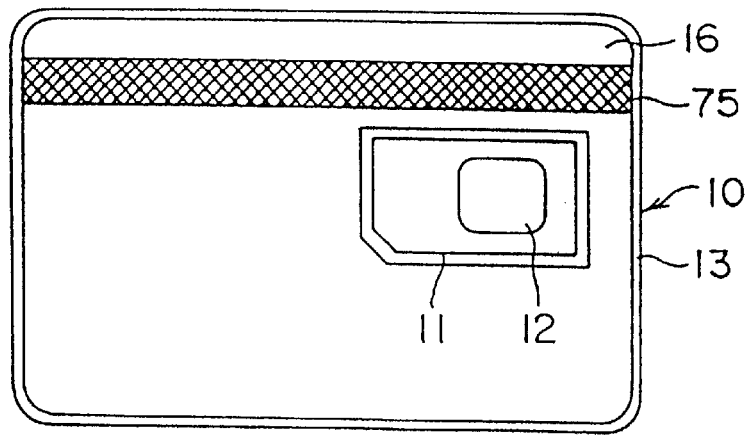
F I G. 38

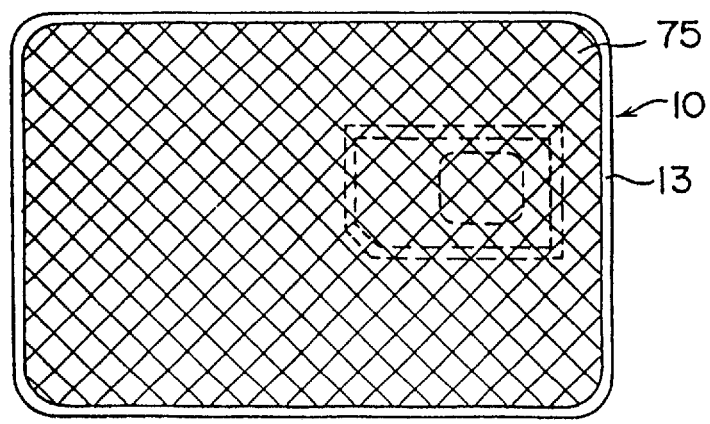
F I G. 39
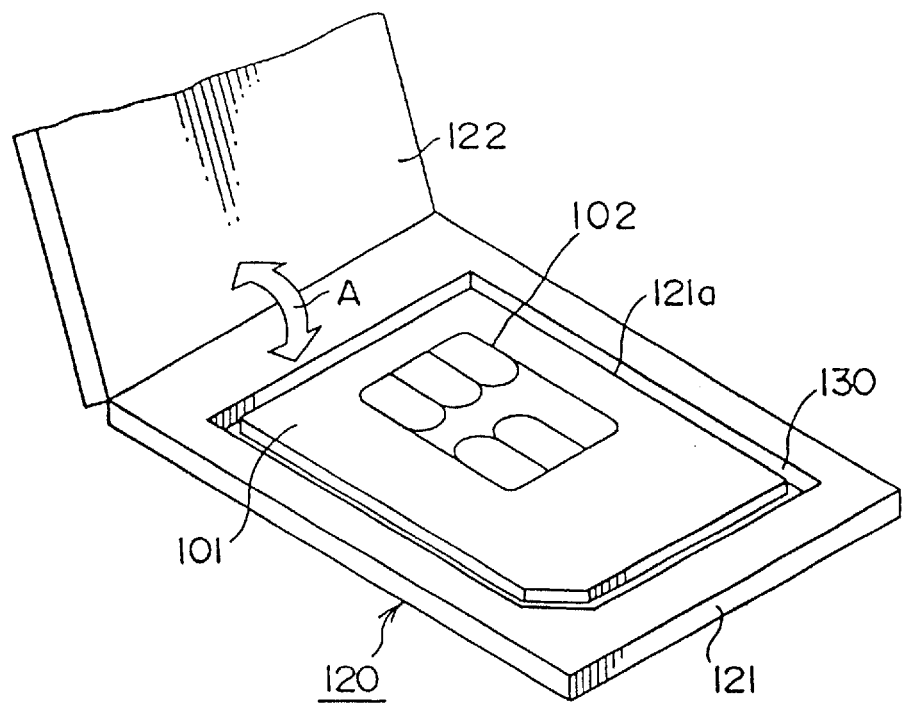
F I G. 40

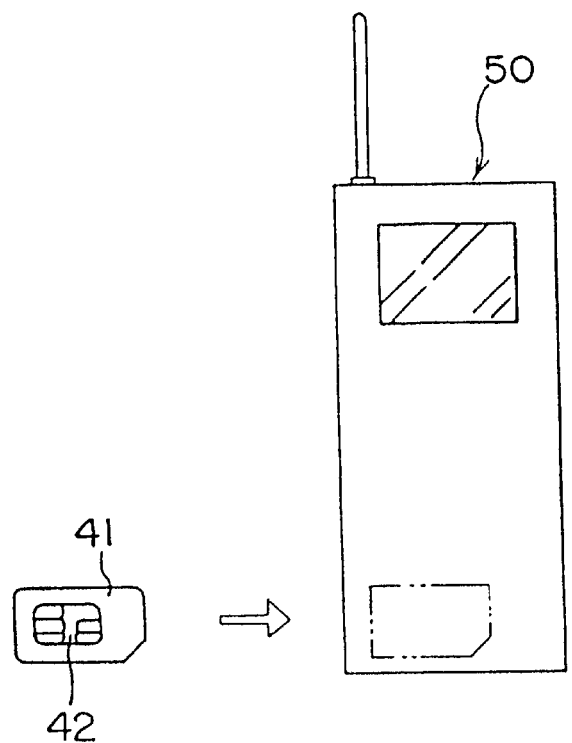
F I G. 47 A
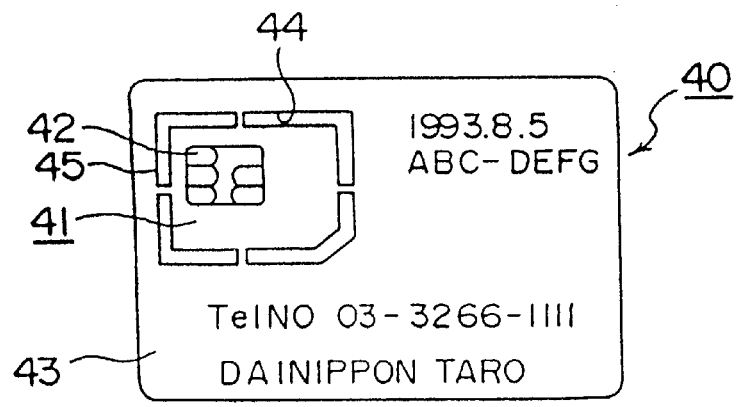
F I G. 47 B

SHEET-FRAMED IC CARRIER, METHOD FOR PRODUCING THE SAME, AND IC CARRIER CASE

This is a division of application Ser. No. 08/961,501, filed Oct. 30, 1997 now U.S. Pat. No. 6,398,114, now allowed which in turn is a division of Ser. No. 08/699,034, filed Aug. 19, 1996, now U.S. Pat. No. 5,757,116 issued May 26, 1998, which in turn is a division of Ser. No. 08/283,292, filed Jul. 28, 1994, now U.S. Pat. No. 5,581,065 issued Dec. 3, 1996.

BACKGROUND OF THE INVENTION

1. Field of the Invention

The present invention relates to a sheet-framed IC carrier (IC carrier with sheet frame), in which a compact IC carrier including a built-in IC module is incorporated with a sheet frame, a method for producing the same, and an IC carrier case.

2. Related Background Art

FIGS. 47A and 47B are drawings to illustrate a conventional IC carrier and a use thereof.

An IC carrier 41 is constructed, as shown in FIG. 47A, in such a manner that an IC module 42 in which a CPU, a memory, and electrodes are incorporated is mounted in a compact base (in the size of about 15 mm×25 mm), which has been used, for example, as a subscriber identity module (SIM) for a portable telephone.

Once a user obtains a subscriber identity module, which is a right for telephone subscription, he or she can purchase a portable telephone 50 among those with common specifications in accordance with his or her purpose and the subscriber identity module (IC carrier 41) is set in the portable telephone 50 purchased whereby he or she can use it.

The IC carrier 41, however, is not entirely popular at present, which limits applications thereof. Accordingly, preparation of purpose-built facilities for mass production of the IC carrier would cause an increase in production cost. In the case of use as a subscriber identity module, a carrier is enclosed in an envelope to be mailed, this requires apparatus for enclosing and sealing and causes possible breakage or loss because of erroneous handling before mounting in a portable telephone 50.

Under such circumstances it is suggested that IC cards 40 are to be produced using existing facilities in such an arrangement, as shown in FIG. 47B, that taking-off slits 44 are formed in card base 43 for IC card 40, leaving a plurality of bridges 45, from which only IC carrier 41 is taken off to be used.

According to the suggestion, not only can existing card production and inspection facilities be used but conventional IC card issue and sending systems can also be used without modification.

With the conventional IC carrier 41 as described, a load such as bend or torsion would be exerted on IC module 42 when removed from the card base (sheet frame) 43, which could cause destruction or popping-out of the IC module.

Another problem was that a bridge 45 sometimes remained on the side of IC carrier 41 after removing the module from card base 43, which made the module hard to be inserted into a mount portion in a portable telephone 50.

SUMMARY OF THE INVENTION

It is an object of the present invention to solve the above-described problems and to provide a sheet-framed IC carrier which can achieve removal of an IC module without an excessive load thereon and without leaving projections of bridges on the circumference of a carrier base, a method for producing it, and an IC carrier case.

The present invention provides, as an eighth aspect, a sheet-framed IC carrier according to the first aspect, wherein an information indicating portion for indicating identification information of the IC carrier is provided on each of the sheet frame and the base of the IC carrier.

The present invention provides, as a ninth aspect, the sheet-framed IC carrier according to the first aspect, wherein a magnetic layer for information, to be written or read, is provided on the other surface of the backing film.

The present invention provides, as a tenth aspect, an IC carrier case for storing an IC carrier having a base and an IC module mounted on the base, comprising a case body in which a storage portion for storing the IC carrier is formed.

The present invention provides, as an eleventh aspect, a method for producing a sheet-framed IC carrier in which an IC carrier having an IC module is secured with a pressure-sensitive adhesive layer on a backing film in an aperture in a sheet frame, comprising a step of mounting an IC module on a sheet card base; a step of sticking a backing film having a pressure-sensitive adhesive layer on one surface thereof onto a back surface of said card base; and a step of cutting and removing a portion corresponding to a peripheral edge of said IC carrier on a top surface of said card base, excluding said backing film, to form a peripheral slit, whereby the sheet frame and the IC carrier secured in the aperture are separated from each other through the peripheral slit.

The present invention provides, as a tweleveth aspect, a method for producing a sheet-framed IC carrier in which an IC carrier having an IC module is secured with a pressure-sensitive adhesive layer on a backing film in an aperture in a sheet frame, comprising a step of forming an aperture in a card base; a step of sticking a backing film having a pressure-sensitive adhesive layer on one surface thereof, onto a back surface of said card base; a step of cutting and removing a region between said aperture and a peripheral edge portion of said card base, leaving the backing film, to form a frame slit, whereby the sheet frame may be separated through the frame slit into two or more frame segments; and a step of securing said IC carrier in said aperture with said adhesive layer on said backing film.

The present invention provides, as a thirteeth aspect, a method for producing a sheet-framed IC carrier in which an IC carrier having an IC module is secured with a pressure-sensitive adhesive layer on a backing film in an aperture in a sheet frame, comprising a step of sticking a backing film having a pressure-sensitive adhesive layer on one surface thereof, onto a back surface of a card base; a step of forming a mount recess for mounting an IC module therein on a top surface of the card base and cutting and removing a portion corresponding to a peripheral edge of said IC carrier, leaving the backing film, to form a peripheral slit portion; and a step of mounting an IC module in said mount recess.

According to the invention of the first aspect, the IC carrier is secured in the sheet frame through a backing film, so that no excessive load is applied on the IC module when the IC carrier is taken out.

According to the invention of the second aspect, the IC carrier is secured in the aperture in the sheet frame with the backing film, wherein when the IC carrier is taken out, the sheet frame is separated into a plurality of frame segments and the IC carrier is peeled off from the backing film.

Accordingly, no excessive load is applied on the IC module and the IC carrier can be taken out easily and safely without breakage or popping-out.

According to the invention of the third aspect, the portion stuck on the region covering the aperture of the backing film is peeled off from the sheet frame with the IC carrier adhering to the portion. The IC carrier is then peeled off from the thus peeled-off portion of the backing film. Accordingly, the IC carrier can be taken out with little load on the IC module.

According to the invention of the fourth aspect, a plurality of IC carriers with a plurality of IC modules are arranged in a single sheet frame. Accordingly, for producing a plurality of related IC carriers, they can be produced from a single sheet frame, rationalizing the production and facilitating the management of the IC carriers.

According to the invention of the fifth aspect, the frictional force is large on the contact surfaces between the backing film and the conveying portion of processing apparatus, the sheet-framed IC carrier can be smoothly conveyed without a slip on the contact surfaces. Then a conveyance error can be prevented.

According to the invention of the sixth aspect, the information recording portion is exposed to the outside when the backing film is stuck on the sheet frame. Accordingly, the information in the information recording portion can be mechanically read even after the backing film is adhered to the sheet frame.

According to the invention of the seventh aspect, the aperture is formed in the card base to form a sheet frame and the backing film is adhered to the back surface of the sheet frame. On the other hand, the IC carrier is formed in a separate flow from that of the sheet frame in the same size as the IC module. The IC carrier is set in the aperture of the sheet frame with the adhesive layer. Accordingly, the IC carrier can be produced in the flow different from that of the sheet frame, which can obviate the spot-facing step to form a recess for mounting an IC module therein, reducing the production time.

According to the invention of the eighth aspect, identification information of IC carrier is indicated both on the sheet frame and on the IC carrier. If the IC carrier is broken, the user can inform the issuing agency of the identification information. Then the issuing agency can specify the IC carrier of the user and efficiently reissue another IC carrier.

According to the invention of the ninth aspect, the adhesive layer and the magnetic layer are formed on two different surfaces of the film and, therefore, the magnetic layer is exposed to the outside after the film is adhered to the sheet frame. Accordingly, necessary information can be written in the magnetic layer even after the film is stuck on the sheet frame, and the information can be read from the magnetic layer.

According to the invention of the tenth aspect, the IC carrier is stored in the case body when not used. Accordingly, no external load is applied on the IC carrier when not used, e.g., when carried, preventing damage to the IC carrier.

According to the invention of the eleventh aspect, an IC card of ordinary size is produced, a backing film is adhered to the back surface of the card, and the peripheral slit is formed outside the peripheral edge of the IC carrier portion, permitting production using the ordinary IC card production facilities.

According to the invention of the twelfth aspect, the aperture is first formed in a conventional card base, the backing film is adhered to the back surface of the base, the frame slit is then formed, and the IC carrier is put in the aperture. Accordingly, the sheet-framed IC carrier can be produced with a conventional card base and the production process can obviate the spot-facing step for mounting the IC module and the inspection step for inspecting characteristics of the IC module after formation of the slit portion, thus reducing the production time.

According to the invention of the thirteenth aspect, the backing film is adhered to the back surface of the card base and thereafter the mount recess and peripheral slit for mount of IC module are successively cut, simplifying the cutting process.

BRIEF DESCRIPTION OF THE DRAWINGS

FIGS. 5A and 5B are drawings to show another modification of the sheet-framed IC carrier according to the present invention;

FIG. 6 is a drawing to show a sheet-framed IC carrier in which a pressure-sensitive adhesive layer is arranged excluding the tip portion of IC carrier;

FIG. 7 is a drawing to show a sheet-framed IC carrier which has a small backing film;

FIGS. 21A and 21B are drawings to show another modification of the present invention;

FIGS. 22A and 22B are drawings to show another modification of the present invention;

FIG. 37 is a drawing to show an IC carrier in the ninth embodiment;

FIG. 38 is a drawing to show the back surface of a sheet-framed IC carrier, showing a magnetic layer;

FIG. 39 is a drawing to show the back surface of a sheet-framed IC carrier, showing a modification of the magnetic layer;

FIG. 40 is a perspective view to show the construction of an IC carrier case according to the present invention;

FIGS. 47A and 47B are drawings to illustrate a conventional IC carrier and a use thereof.

DESCRIPTION OF THE PREFERRED EMBODIMENTS

The present invention will be described as to preferred embodiments in detail with reference to the accompanying drawings.

First Embodiment

Figure 1A:
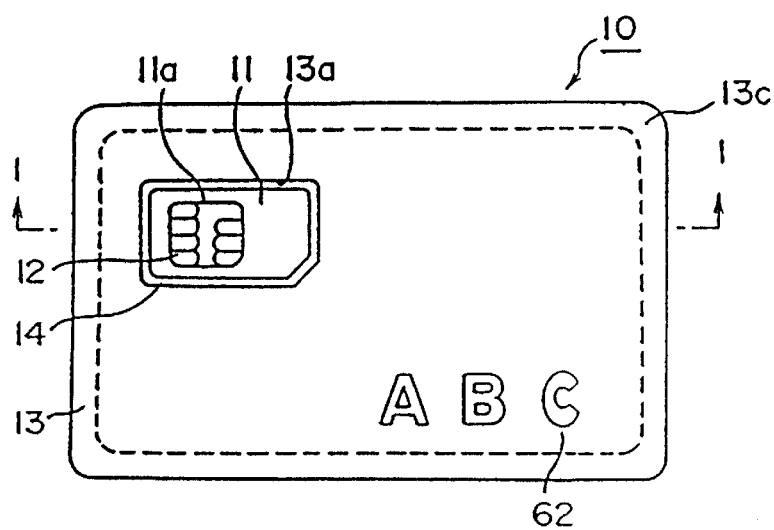
FIGS. 1A, 1B, and 1C are drawings of a sheet-framed IC carrier to show a first embodiment of the present invention.
Figure 1C:
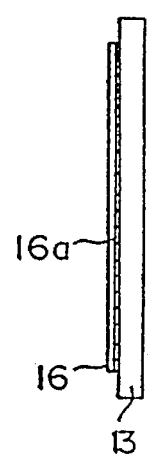
Figure 1B:
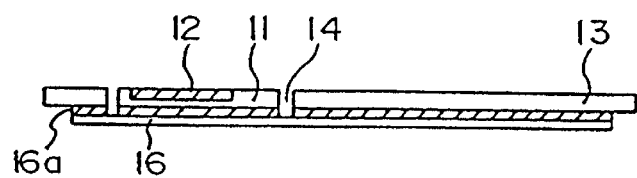
Figure 2:
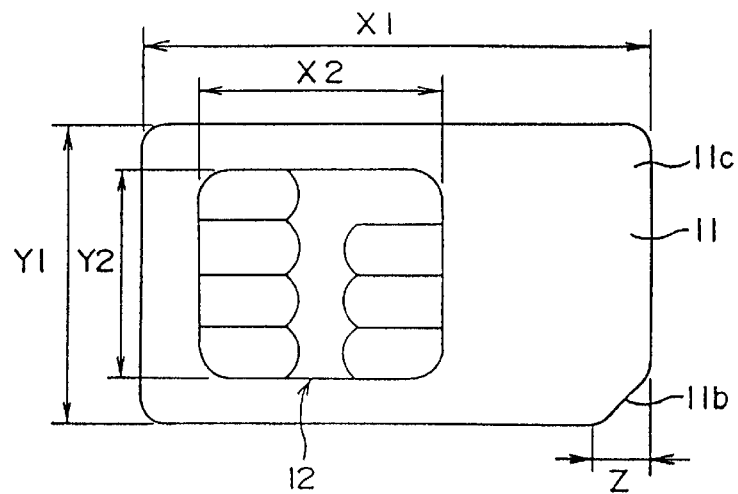
FIG. 2 is a drawing to show an IC carrier in the first embodiment.
Figure 3A:
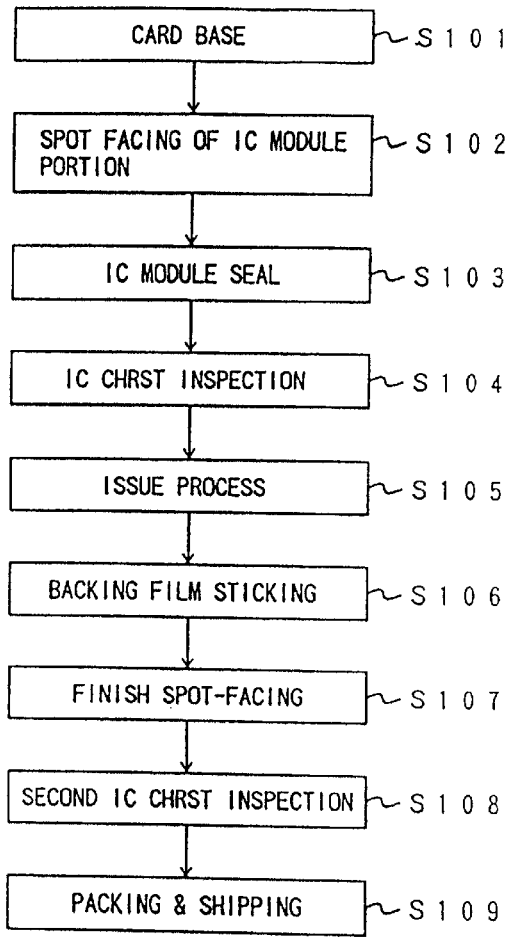
FIGS. 3A and 3B are process drawings to show methods for producing the sheet-framed IC carrier according to the present invention.
Figure 3B:
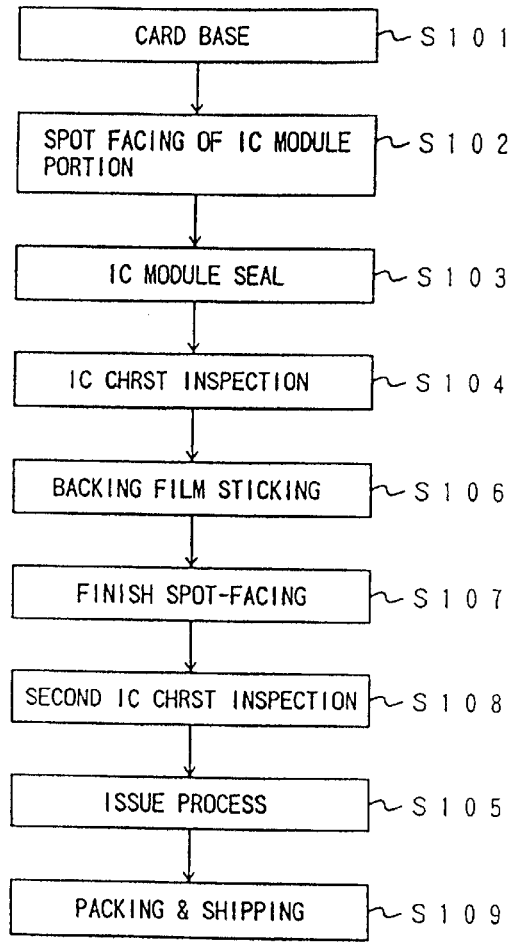

FIGS. 1A, 1B, and 1C are drawings to show the first embodiment of the sheet-framed IC carrier according to the present invention; FIG. 2 is a drawing to show an IC carrier in the first embodiment; and FIGS. 3A and 3B are process drawings to show an embodiment of a method for producing the sheet-framed IC carrier according to the present invention.

In the present embodiment a sheet-framed IC carrier 10 is mainly composed of an IC carrier 11, a sheet frame 13, and a backing film 16. The sheet frame 13 is a resin sheet, for example, of polyvinyl chloride, having an aperture 13a. The backing film 16, having a pressure-sensitive adhesive layer 16a on one surface is adhered via the adhesive layer 16a to the back surface of sheet frame 13, covering the back side of aperture 13a.

Preferably, the backing film 16 has the shape (profile) either the same as or a little smaller (specifically, about 2 mm smaller in each direction) than the outside shape (profile) of sheet frame 13, as shown in FIGS. 1A, 1B, and 1C. The thickness of backing film 16 is in the range of 80 to 200 $\mu$m, preferably about 100 $\mu$m. A preferable thickness range of pressure-sensitive adhesive layer 16a is about 20 to 23 $\mu$m. Such thickness ranges provide the strength sufficient to secure IC carrier 11, but cause no hindrance in the use of the existing production facilities.

The IC carrier 11 carrying IC module 12 is fit in the aperture 13a in sheet frame 13, leaving a peripheral slit 14 around the carrier, and is secured on the back surface with the pressure-sensitive adhesive layer 16a on the backing film 16. The pressure-sensitive adhesive layer 16a has such weak tackiness that it loses the tackiness once peeled off after first adhesion. Print information 62 is given on the surface of sheet frame 13. The print information 62 may be printed on the surface of backing film 16.

The IC carrier 11 is so arranged, as shown in FIG. 2, that an IC module 12 sized in the height Y2 of about 10.6 mm by the width X2 of about 12.0 mm is mounted on a resin base 11c sized in the height Y1 of about 15.00 mm by the width X1 of about 25.00 mm and that a cut 11b of about 3.00 mm is formed at a corner as Z for positioning upon mounting the carrier into a selected device.

Next described is a method for producing the framed IC carrier 10.

As shown in FIG. 3A, a card base 13c is first produced according to the ordinary method for producing plastic cards (step 101), and a spot-facing step is carried out to produce a module portion to become a mounting recess 11a for IC module 12, using a spot-facing machine (step 102). Then IC module 12 is set in the mounting recess 11a through a thermosetting adhesive and is placed on a hot plate to secure it there, thus performing a module seal step (step 103).

Next, an inspection step is conducted to inspect the characteristics or performance of IC (step 104). An issue step is next carried out to write data according to a purpose of use of IC carrier 10 (step 105). The above steps are the same as those in the ordinary method for producing IC cards.

Then the backing film 16 is adhered to the back surface of card base 13c (step 106), and thereafter, using the spot-facing machine, a finish spot-facing step is carried out to form a peripheral slit 14 (step 107). In this step, the cutting depth may be such that only the card base is cut, such that the adhesive layer 16a on the backing film 16 is also cut in addition to the card base, or such that even a part of film 16 is also cut without completely cutting through the backing film 16.

Then a secondary IC inspection step (step 108) is carried out to inspect characteristics or performance of IC after formation of the slit.

This step may be omitted if no damage on IC is expected in forming the slit. After that, the framed IC carrier 10 is set in a slit mount, which is enclosed and sealed in an envelope, performing a packing and shipping step (step 109).

The above method uses the conventional production facilities for IC cards, which can readily perform the various inspection steps (steps 104 and 108) and the packing and shipping step (step 109) including the enclosing operation into an envelope, not preferred easily an IC carrier alone, and which can fully assure machining accuracy.

The framed IC carrier may be produced by another production method as shown in FIG. 3B instead of the production method shown in FIG. 3A. The method shown in FIG. 3B is so arranged that the issue process (step 105), which was carried out after the IC inspection step (step 104) in the above method of FIG. 3A, is moved to after the secondary IC inspection step (step 108).

A user receiving the framed IC carrier 10 peels off the IC carrier 11 from the sheet frame 13 and sets it into a mount portion in a selected device. On this occasion the IC carrier 11 is just peeled off from the backing film 16, which prevents an excessive load from being exerted on IC module 12. Further, since the adhesive layer 16a on the backing film 16 has weak tackiness, the back surface of IC carrier 11 retains little tackiness.

Further, since there are no bridges, a difference from conventional cases, no projections remain. Thus, the IC carrier can be positively mounted into the mount portion in the selected device.

Generally, cards, such as sheet frame 13, are defined in the thickness of 0.76±0.08 mm. For the sheet frame 13 of such thickness, the width of peripheral slit 14 is preferably in the range of 0.1 to 5.0 mm. If the width of peripheral slit 14 exceeds 5.0 mm, the appearance of sheet frame is degraded; if it is below 0.1 mm, the spot-facing step is too difficult. With the thickness of peripheral slit 14 below 0.5 mm, it is difficult to peel off only IC carrier 11 from the backing film 16. In that case, a preferable arrangement is such that after peeling off the backing film 16 from the sheet frame 13, the IC carrier 11 is then removed from the backing film 16.

FIGS. 4A and 4B and FIGS. 5A and 5B are drawings to show further embodiments of the sheet-framed IC carrier according to the present invention. In the following description elements with same functions as those in the embodiment shown in FIGS. 1A–1C and FIG. 2 are denoted by numerals with same last digits, and redundant description will be omitted.

Figure 4A:
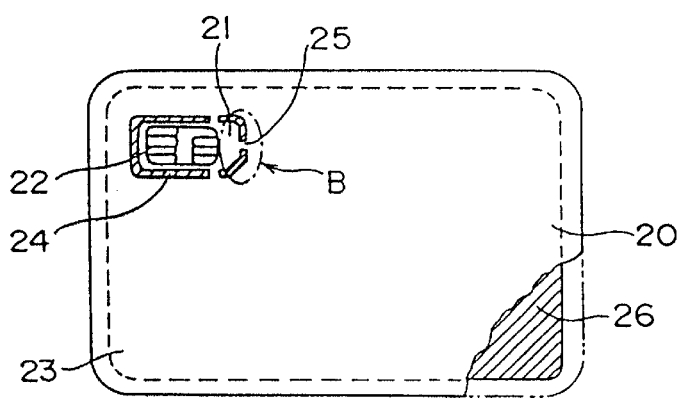
FIGS. 4A and 4B are drawings to show a modification of the sheet-framed IC carrier according to the present invention.
Figure 4B:
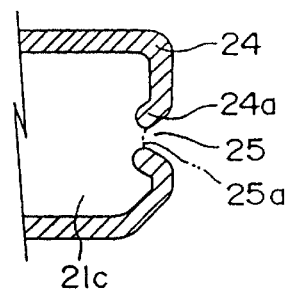

As shown in FIGS. 4A and 4B, a framed IC carrier 20 is so arranged that a peripheral slit 24 is formed leaving a bridge portion 25 partly connecting the IC carrier 21 and the sheet frame 23. The peripheral slit 24 has portions 24a to get in over the outer edge of base 21c of IC carrier 21 carrying IC module 22. The peripheral slit 24 is formed by the spot-facing machine, so that slit ends are circular, making the bridge width of bridge portion 25a narrower than that of adjacent portion 25. When the IC carrier 21 attached to the backing film 26 is removed from the sheet frame 23, the bridge 25 is broken between two inward portions 24a, thus reducing the possibility of leaving a projection. Even if a small projection remains, it would never project out from the outer edge, and not interfere with the mounting operation of the IC carrier 21 into the mount portion in the selected device.

FIGS. 5A and 5B show another embodiment in which a peripheral slit 34 is provided in a framed IC carrier 30, similarly as in the embodiment shown in FIGS. 4A and 4B, and in which the thickness of a bridge portion 35a between two inward portions 34a of peripheral slit 34 is arranged thinner than that of adjacent portion 35 of base 31c of IC carrier 31. This arrangement has an advantage that the bridge portion 35a can be broken more easily.

The present invention is by no means limited to the above-described embodiments, but may have various modifications and changes. The present invention is intended to include all such modifications and changes.

In the case of the embodiments shown in FIGS. 4A and 4B and in FIGS. 5A and 5B, the backing film does not necessarily have to be adhered to the back surface.

Next described are further embodiments as shown in FIG. 6 and FIG. 7. In the embodiment shown in FIG. 6, IC carrier 11 has a tip portion 61 which is not secured by the backing film 16. In more detail, a backing film 16 has no pressure-sensitive adhesive layer 16a in the region of tip portion 61 of IC carrier 11, so that the tip portion 61 is in a floating state over the backing film 16. Because of this arrangement, the IC carrier 11 can be peeled off very easily from the tip portion 61.

As shown in the embodiment of FIG. 7, the profile of backing film 16 does not always have to be matched with that of sheet frame 13, but may be a little larger (e.g., about 2 mm larger in each direction) than the profile of aperture 13a in the sheet frame 13.

By limiting the profile of backing film 16 based on the aperture 13a as described, the cost may be reduced for materials for the backing film 16.

The sheet frame may be made of acrylic, polycarbonate, or ABS as well as polyvinyl chloride. An acrylic frame or a polycarbonate frame is easy to cut, so that the spot facing is easy and accurate.

Although the above embodiments showed the examples in which the pressure-sensitive adhesive layer 16a on backing film 16 had weak tackiness, the adhesive layer may be arranged with semipermanent tackiness to permit repetitions of sticking and peeling off IC carrier 11 and to permit storage of the IC carrier as the sheet-framed IC carrier 10.

Further, it is preferred that the color of backing film 16, particularly the color of pressure-sensitive adhesive layer, is made different from that of sheet frame 13. For example, if the sheet frame 13 is white, the adhesive layer 16a on backing film 16 should be colored in a color different from white, for example in blue. Arranging the color of adhesive layer 16a on backing film 16 different from that of sheet frame 13, as described above, the color difference can be utilized to detect the position of peripheral slit 14 in a completed, framed IC carrier 10, for example. Namely, the position of peripheral slit 14 can be readily detected as comparing the color of adhesive layer 16a on backing film 16 appearing on the bottom of peripheral slit 14, with the color of sheet frame 13.

Also, the backing film 16 may be made of an optically transparent material. In that case, the position of peripheral slit 14 can also easily and surely be detected by applying light to the completed framed IC carrier 10 on the top or on the bottom and detecting transmitted light through the backing film 16.

As detailed above, the present invention is effective to prevent an excessive load from being imparted on an IC module in removing IC carrier, because the IC carrier is fixed through the backing film to the sheet frame. Arranging the bridge portion inside the outer edge of IC carrier, a projection left in removing the IC carrier, if any, can be kept from projecting the original outer edge. Further, arranging the thickness of the bridge portion as thinner than that of the carrier base or arranging the bridge width narrower than the other portions, no excessive load appears on the IC module and the possibility of leaving a projection is further reduced. Further, the sticking of backing film permits sure fixation of IC carrier. Also, the existing production facilities for IC cards can be used without modification to produce the sheet-framed IC carrier, whereby the facilities can be effectively used and the production cost can be lowered.

Second Embodiment

The second embodiment of the sheet-framed IC carrier and the production method thereof according to the present invention will be described referring to the drawings.

Figure 8A:
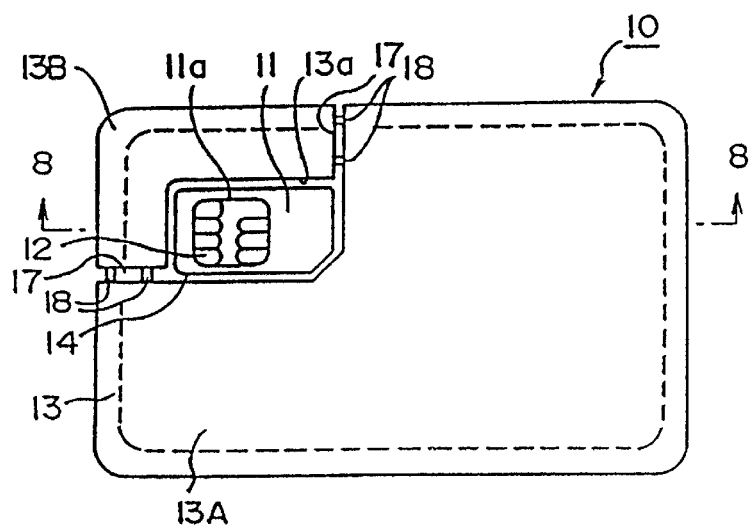
FIGS. 8A, 8B, and 8C are drawings of a sheet-framed IC carrier to show a second embodiment of the present invention.
Figure 8C:
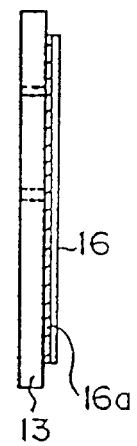
Figure 8B:
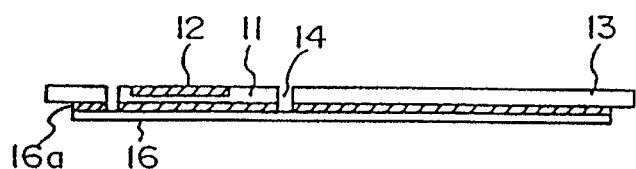
Figure 9:
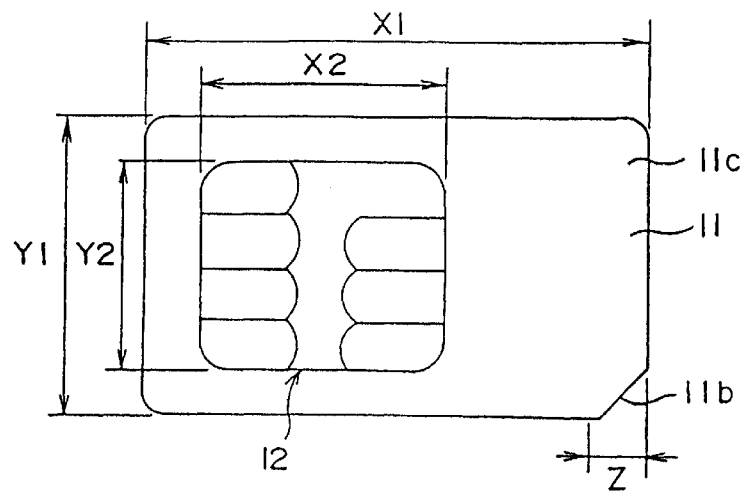
FIG. 9 is a drawing to show an IC carrier in the second embodiment.
Figure 12A:
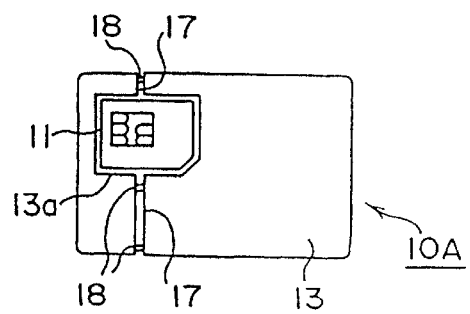
FIGS. 12A, 12B, 12C, and 12D are plan views to show modifications of the sheet-framed IC carrier.
Figure 12C:
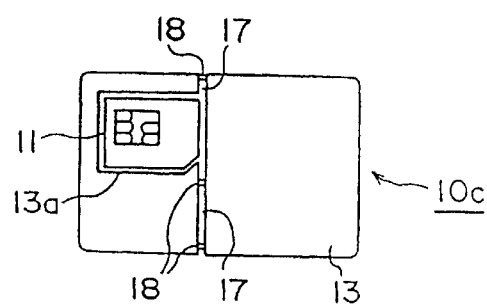
Figure 12B:
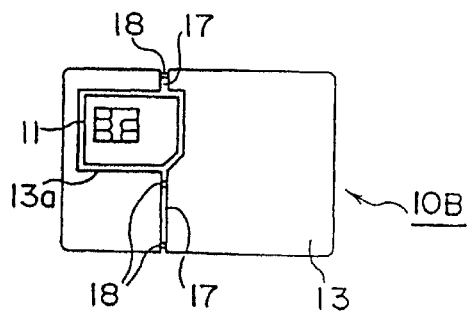
Figure 12D:
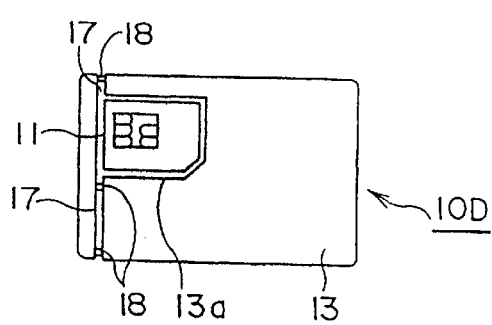

FIGS. 8A, 8B, and 8C are drawings to show the second embodiment of the sheet-framed IC carrier according to the present invention, and FIG. 9 is a drawing to show an IC carrier.

In the present embodiment a sheet-framed IC carrier 10 is mainly composed of an IC carrier 11, a sheet frame 13, and a backing film 16. The sheet frame 13 is a resin sheet, for example, of polyvinyl chloride, which has an aperture 13a in a partial region.

The backing film 16 has a pressure-sensitive adhesive layer 16a on one surface, which is stuck on the back surface of sheet frame 13 through the adhesive layer 16a, covering the back side of aperture 13a. The external shape of backing film 16 is preferably the same as or a little (about 2 mm) smaller than that of sheet frame 13, and the thickness of backing film 16 is in the range of 80 to 200 $\mu$m, preferably about 100 $\mu$m. A preferable thickness range of adhesive layer 16a is about 20 to 23 $\mu$m. Such thickness ranges assure the strength sufficient to secure the IC carrier 11 and give no hindrance in using the existing production facilities.

The IC carrier 11 having IC module 12 is fit in the aperture 13a in sheet frame 13, where it is fixed by the adhesive layer 16a on the backing film 16 on the back side. The adhesive layer 16a has such weak tackiness that it loses its tackiness once peeled off after first stuck. A peripheral slit 14 is provided at an appropriate gap between the aperture 13a and IC carrier 11.

Figure 14A:
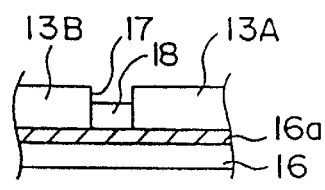
FIGS. 14A and 14B are local cross sections to show a frame slit and bridge portion.
Figure 14B:
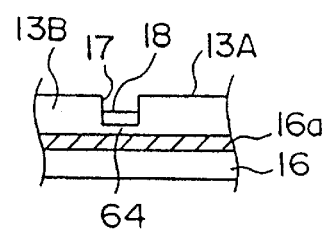

Further, frame slits 17 open like a groove are formed between the aperture 13a in sheet frame 13 and the peripheral edges thereof. Through the frame slits 17 the sheet frame 13 can be divided into frame segments 13A and 13B. Further, bridges 18 are formed in part of frame slits 17 to connect the frame segments 13A and 13B. The bridges 18 are constructed of connection pieces with strength to be relatively readily broken. Namely, the frame slits 17 are intermittently formed leaving the bridges 18 on the plan view shown in FIG. 8A. Also, the frame slits 17 may be formed as shown in the side view of FIG. 14A to penetrate the sheet frame 13 in the vertical direction or may be formed as shown in FIG. 14B to leave bottom connecting portions 64 of sheet frame 13.

The IC carrier 11 is so arranged, as shown in FIG. 9, that an IC module 12 sized in the height Y2 of about 10.6 mm by the width X2 of about 12.0 mm is mounted on a resin base 11c sized in the height Y1 of about 15.00 mm by the width X1 of about 25.00 mm and that a cut 11b of about 3.00 mm is formed at a corner as Z for positioning upon mounting of IC carrier into a selected device.

Figure 10A:
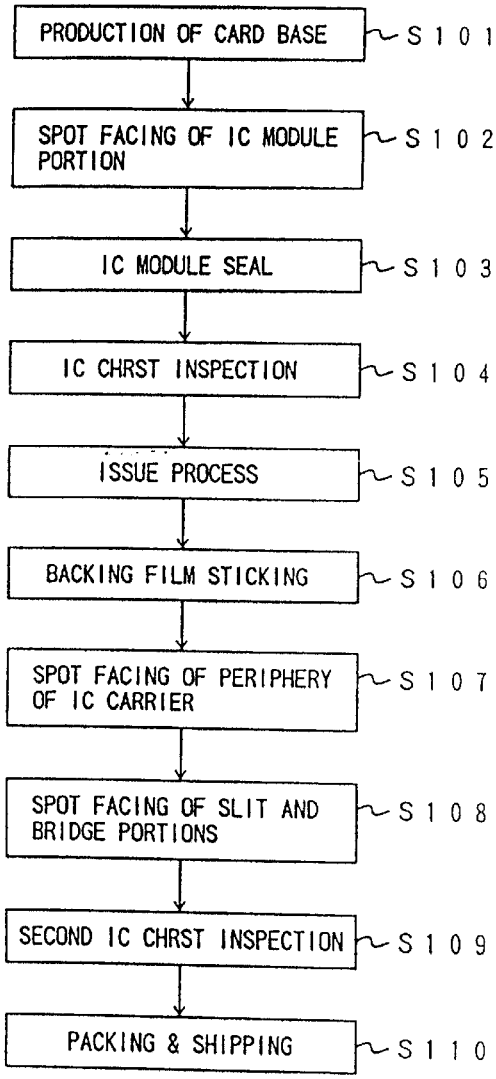
FIGS. 10A and 10B are process drawings to show methods for producing the sheet-framed IC carrier.
Figure 10B:
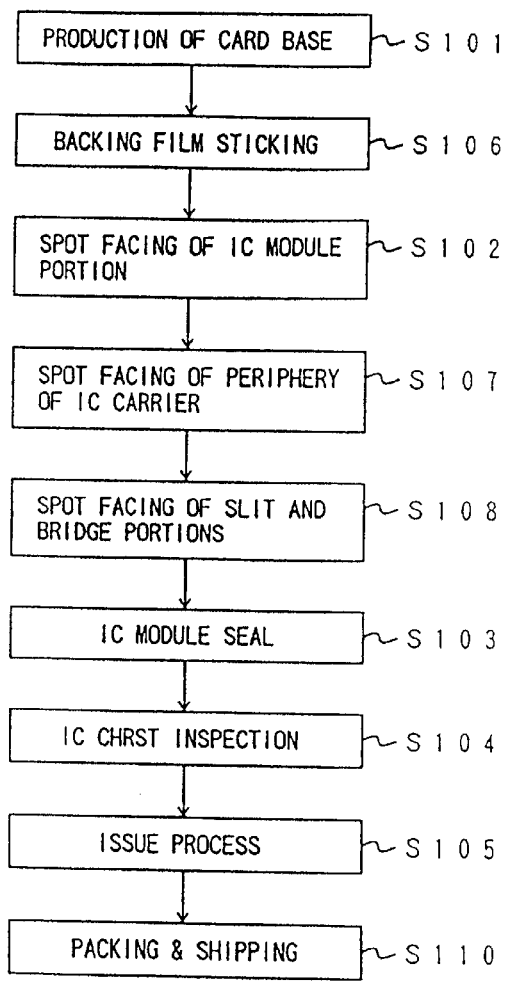

Methods for producing the sheet-framed IC carrier are next described referring to FIGS. 10A, 10B and FIGS. 11A, 11B. FIGS. 10A and 10B are process drawings to show embodiments of the method for producing the sheet-framed IC carrier according to the present invention, and FIGS. 11A and 11B process diagrams to show further embodiment.

A first example is described referring to FIG. 10A. In FIG. 10A, a card base 13 is first produced according to the ordinary method for producing plastic cards (step 101), and using a spot-facing machine, a spot-facing process is carried out to form an IC module portion to become a mounting recess 11a for IC module 12 (step 102). Then the IC module 12 is set in the mounting recess 11a and a module seal step using a module sealer is carried out to mount the IC module 12 on card base 13 (step 103).

Next, an inspection step is carried out to inspect characteristics or performance of IC (step 104). Then an issue process is carried out to write data according to the purpose of IC carrier 11 (step 105). The above steps are the same as those in the ordinary IC card production method.

The backing film 16 is then put on the back surface of card base 13 (step 106) and thereafter, using the spot-facing machine, a spot-facing process is carried out to cut and remove a region outside a portion corresponding to the outer edge of IC carrier 11 to form a groove as a peripheral slit 14 (step 107).

Further, another spot-facing step is carried out to cut and remove portions at predetermined positions between the peripheral slit 14 and the outer edges of card base 13 in the form of groove to form frame slits 17 and bridges 18 (step 108). In step 107 and step 108, the cutting may be such that only the card base is cut, such that the adhesive layer 16a on backing film 16 is also cut, or such that even a portion of backing film 16 is also cut without completely cutting through the backing film 16.

Then a secondary IC inspection step is carried out to inspect characteristics or performance of IC after the formation of frame slits 17 (step 109). This step can be omitted if steps 107 and 108 cause no damage on IC module 11a. After that, the framed IC carrier 10 is set in a slit mount, which is enclosed and sealed in an envelope, performing a packing and shipping step (step 110).

The above method employs the conventional IC card production facilities, which can perform various inspection steps (steps 104 and 109) and the packing and shipping step including the enclosing operation into the envelope (step 110), not easy with the IC carrier 11 alone, and which can assure sufficient machining accuracy.

Instead of the steps shown in FIG. 10A, the method shown in FIG. 10B may be employed, in which a card base 13 is first produced (step 101) and thereafter a backing film 16 is put on the back surface of card base 13 (step 106). In this method, the subsequent steps are successively conducted in the order of the IC module portion spot-facing step (step 102), the IC carrier peripheral edge spot-facing step (step 107), and the slit and bridge spot-facing process (step 108). Then, successively performed are the IC module seal step (step 103), IC inspection step (step 104), and the issue step (step 105). After that, the packing and shipping step (step 110) is carried out. In the above steps shown in FIG. 10B, the spot-facing steps (steps 102, 107, and 108) are continuously performed, which can simplify the spot-facing operation. At the same time, a single IC inspection is sufficient for inspecting characteristics or performance of the IC after the spot-facing steps as performed in the continuous operation.

Figure 48A:
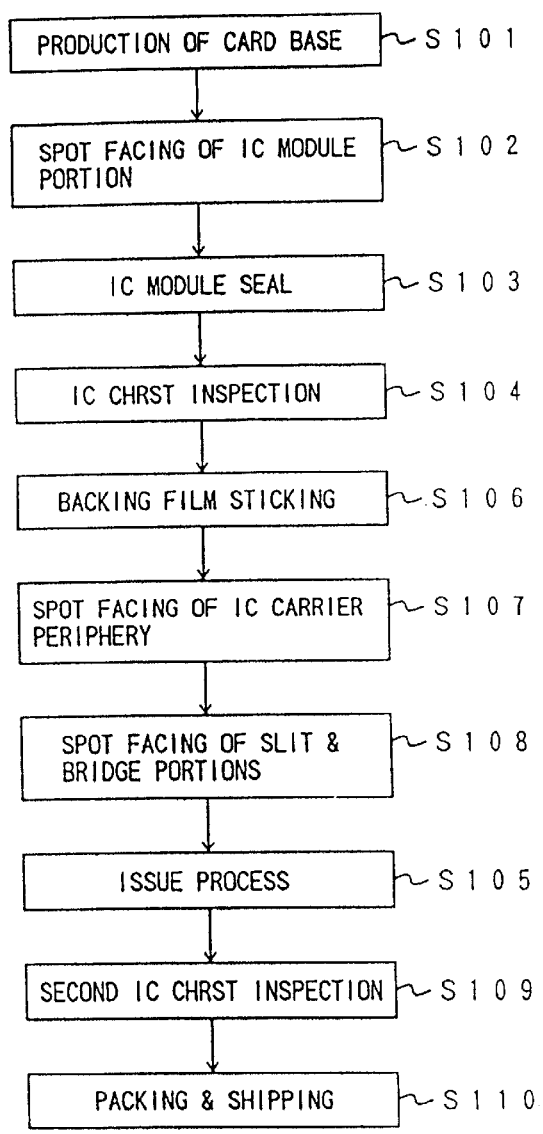
FIGS. 48A and 48B are drawings to show further methods for producing the sheet-framed IC carrier as shown in FIG. 10.
Figure 48B:
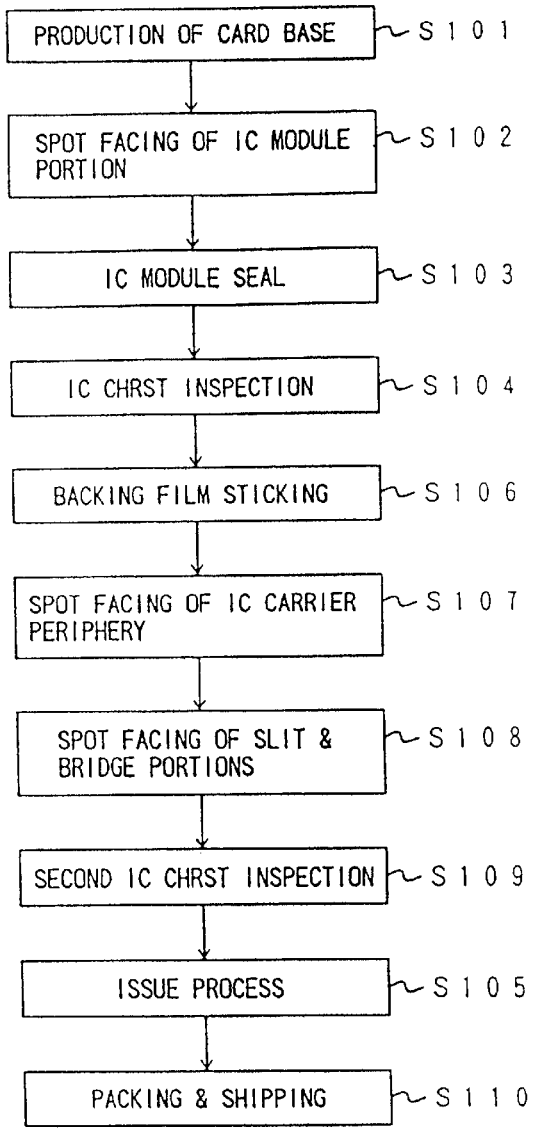

The steps shown in FIG. 10A may be modified as shown in FIG. 48A or in FIG. 48B. In detail, the issue step (step 105) may be put after the slit and bridge spot-facing step (step 108) (FIG. 48A) or after the secondary IC inspection step (step 109) (FIG. 48B).

Figure 11A:
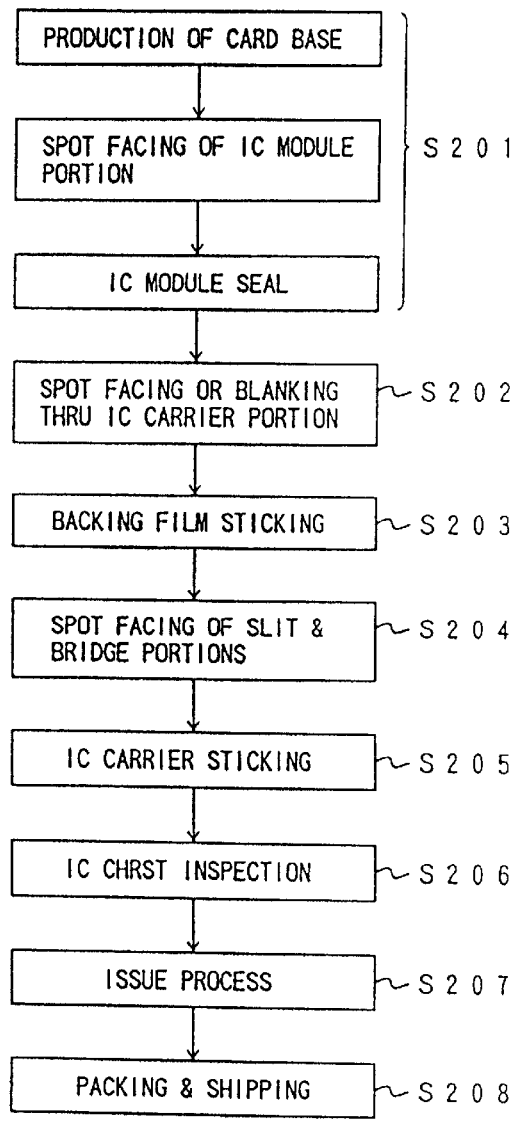
FIGS. 11A and 11B are process drawings to show further methods for producing the sheet-framed IC carrier.
Figure 11B:
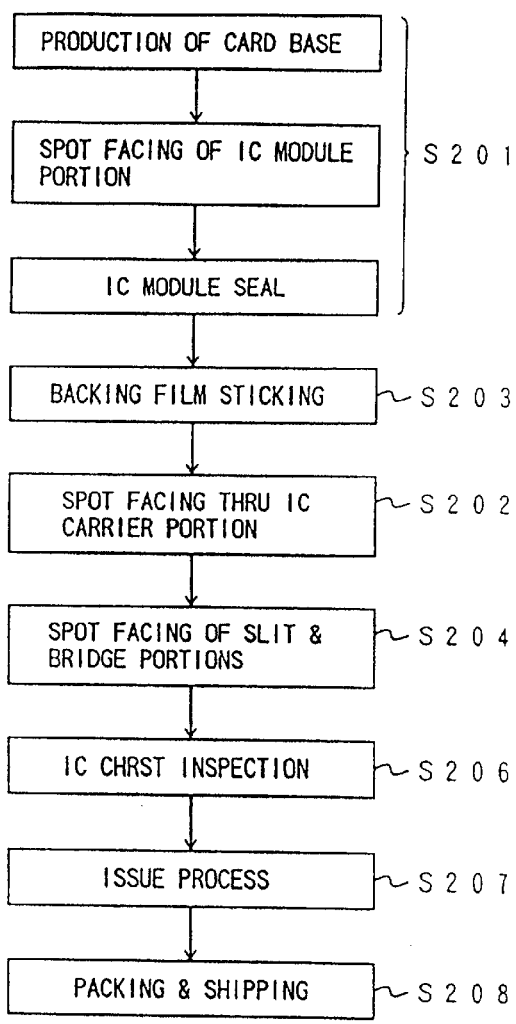

Further embodiments are next described referring to FIGS. 11A and 11B. In FIG. 11A, according to the ordinary method for producing plastic cards, a card base 13 is produced, a mounting recess ha for an IC module 12 is formed by spot facing using a spot-facing machine, and IC module 12 is set and sealed in the mounting recess 11a (step 201). A spot-facing or blanking step for peripheral slit 14 is next performed to form an aperture 13a where the IC carrier 11 is set, using a spot-facing machine or a press machine, to blank out a portion of IC carrier 11 (step 202). Then a backing film 16 is put on the back surface of the card base (step 203). After that, using the spot-facing machine, a spot-facing step is carried out to cut and remove portions at predetermined positions between aperture 13a and the peripheral edges of card base 13 in the form of groove, forming frame slits 17 and bridges 18 (step 204). Here, similarly as in the case of FIGS. 10A and 10B, the cutting may be such that only the card base 13 is cut, such that the adhesive layer 16a on backing film 16 is also cut, or such that even a portion of backing film 16 is also cut without completely cutting through the backing film 16.

A sticking process of IC carrier 11 is next performed to set the blanked IC carrier 11 in the aperture 13a so as to be fixed through the adhesive layer 16a on the backing film 16 (step 205). In this case, the IC carrier 11 may be one independently formed in a separate step from the card base 13. The IC carrier 11 is formed in such a size that when it is set in the aperture 13a, a peripheral slit 14 is given at an appropriate gap between the aperture 13a and the IC carrier 11.

As described above, the IC carrier 11 may be one where an IC module 12 is mounted on a base of the same resin as the card base 13 or one where the IC carrier 11 itself is formed as IC module 12 (i.e., the IC carrier 11 is formed in the dimensions of IC module 12).

An inspection step is next carried out to inspect characteristics or performance of IC (step 206). Then an issue step is conducted to write data according to the purpose of IC carrier 11 (step 207). After that, the framed IC carrier 10 is set in a slit mount, which is enclosed and sealed in an envelope, performing a packing and shipping step (step 208).

Instead of the steps shown in FIG. 11A, the method shown in FIG. 11B may be employed. In the method in FIG. 11B, a card base 13 is first produced, a recess is formed by spot facing for IC module portion, the IC module is sealed in the recess (step 201) and thereafter a backing film 16 is put on the back surface of card base 13 (step 203). Then, successively performed are an IC carrier portion spot-facing step (step 202') and a slit and bridge spot-facing step (step 204). In this case, the IC carrier 11 is held by the backing film 16, because the backing film 16 is put on the back surface. Then successively performing an IC inspection step (step 206) and an issue step (step 207), a packing and shipping step (step 208) is carried out.

The spot-facing operation can be simplified by continuously performing the spot-facing steps (steps 202 thru 204) in the steps shown in FIG. 11B.

A user receiving the framed IC carrier 10 separates the sheet frame 13 into frame segments 13A and 13B. The user can easily break the bridges 18, for example, by bending, twisting, or pulling one frame segment relative to the other frame segment to separate the frame segment 13A from the frame segment 13B. On this occasion the IC carrier 11 is arranged not to contact the frame segments 13A and 13B, thus preventing an excessive load from being exerted on IC carrier 11 upon the separation.

After the frame segment 13A is separated from the frame segment 13B, the user can pinch at least one side of IC carrier 11 without interference from sheet frame 13. Therefore, the IC carrier 11 can readily and safely be peeled off from the backing film 16 without an excessive load thereon. In this case the user does not need to push the bottom of IC carrier 11 through the backing film 16, which can prevent the IC module 12 from being broken or popping out.

Also, the adhesive layer 16a on the backing film 16 has weak tackiness, so that no adhesive is left on the back surface of IC carrier 11 after the separation. The IC carrier 11 thus peeled off is mounted into a mount portion in a selected device. Since there is no projection on the outer edge of IC carrier 11, a difference from conventional cases, the IC carrier can positively be mounted in the mount portion in the selected device.

FIGS. 12A, 12B, 12C, 12D and FIGS. 13A, 13B, 13C, 13D are plan views to show sheet-framed IC carriers 10A–10H as modifications of the IC carrier according to the present invention.

Each frame slit 17 shown in FIG. 12A, FIG. 12B, FIG. 12C, or FIG. 12D is approximately linearly formed between an aperture 13a and the upper and lower peripheral edges of sheet frame 13 in the drawing. The frame slit 17 intersects with the aperture 13a nearly in the central portion in the example of FIG. 12A, a little right in the example of FIG. 12B, on the right end in the example of FIG. 12C, or on the left end in the example of FIG. 12D. Forming the frame slit 17 along the transverse direction of sheet frame 13 as in FIG. 12A, 12B, 12C, or 12D facilitates separation of sheet frame 13.

Figure 13A:
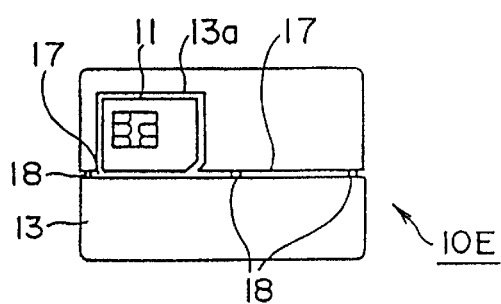
FIGS. 13A, 13B, 13C, and 13D are plan views to show further modifications of the sheet-framed IC carrier.
Figure 13C:
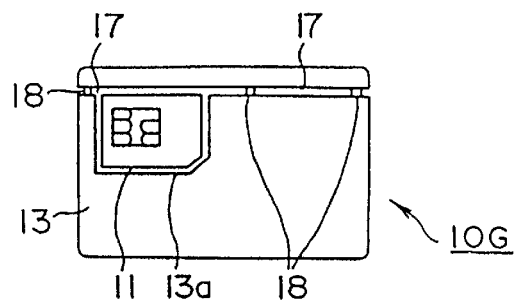
Figure 13B:
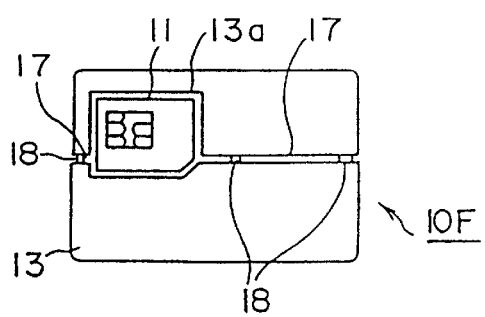

Each frame slit 17 shown in FIG. 13A, FIG. 13B, or FIG. 13C is approximately linearly formed between an aperture 13a and the left and right peripheral edges of sheet frame 13 in the drawing. The frame slit 17 intersects with the aperture 13a on the lower end in the example of FIG. 13A, nearly in the central portion in the example of FIG. 13B, or on the upper end in the example of FIG. 13C. Forming the frame slit 17 in this manner, the longitudinal side of IC carrier 11 can be pinched after the separation.

Figure 13D:
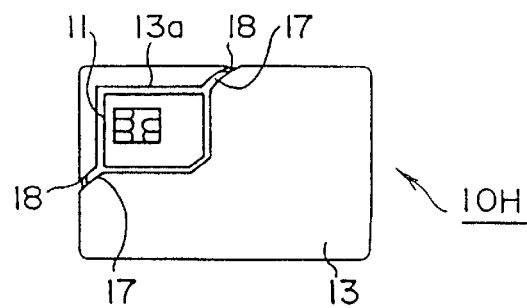

As shown in FIG. 13D, a slit 17 does not have to be formed in a linear shape, but may be formed in a curved shape.

The embodiments of the sheet-framed IC carrier and production method thereof according to the present invention were described above. It should, however, be noted that the present invention is by no means limited to the above embodiments, but may be modified in various forms within a range not departing from the essence thereof.

For example, the above embodiments showed the examples in which two frame slits 17 were formed between the aperture 13a and the peripheral edges of sheet frame 13 to separate the sheet frame into frame segments 13A and 13B, but three or more slits 17 may be formed to separate the sheet frame into three or more frame segments 13A, 13B, . . .

Also, the frame slits 17 do not necessarily have to be opened through. For example, as shown in FIG. 14B as described previously, the frame slits 17, are formed, for example, in the form of nearly V-shaped groove with a thin bottom connecting portion 64 connecting between frame segments 13A and 13B, which can obviate the bridges 18.

The bridges 18 may be provided in any shape or in any number as long as they can be broken relatively easily. Further, the bridges 18 were formed by cutting and removing the card base, but the sheet frame 13 may be provided with plastic members fusion-bonded thereto, for example.

If the backing film 16 has enough rigidity to support the frame segments 13A, 13B, the bridges 18 do not necessarily have to be formed.

Since the sheet-framed IC carriers according to the present invention are so arranged that, upon taking off the IC carrier, the IC carrier is peeled off from the backing film after the sheet frame is divided into a plurality of frame segments, the IC carrier can easily and safely be taken out preventing an excessive load from being exerted on the IC module or preventing the IC carrier from being broken or popping out.

According to the production methods of the IC carrier of the present invention, conventional IC card production facilities can be used without modification to produce the sheet-framed IC carrier, effectively utilizing the facilities and reducing the production cost. Further, the methods can omit the spot-facing step for the mount of IC module, and the inspection step for inspecting characteristics or performance of the IC module after the spot-facing of the peripheral edge of IC carrier, which can reduce the production time and can improve the productivity.

Third Embodiment

Figure 15A:
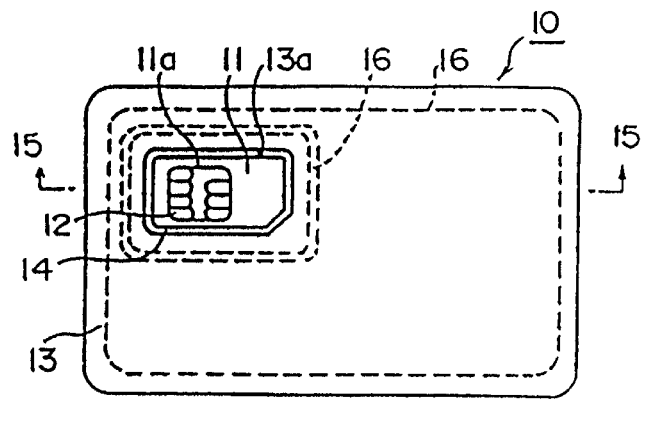
FIGS. 15A, 15B, 15C, and 15D are drawings of a sheet-framed IC carrier to show a third embodiment of the present invention.
Figure 15C:
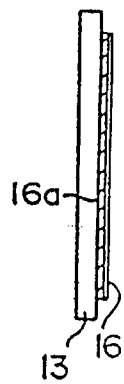
Figure 15B:
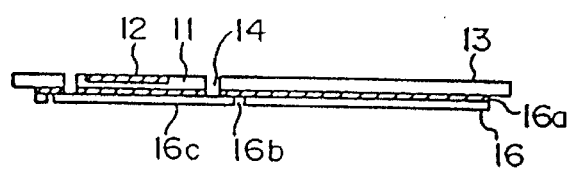
Figure 15D:
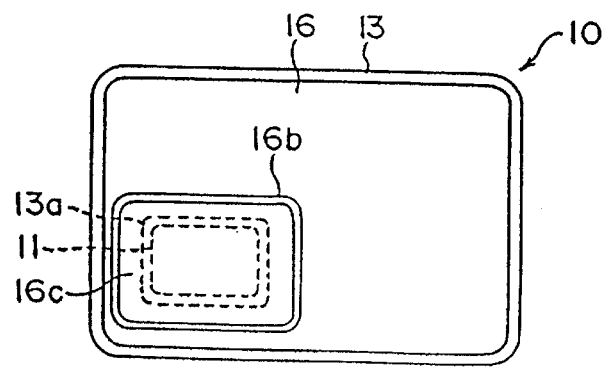
Figure 16:
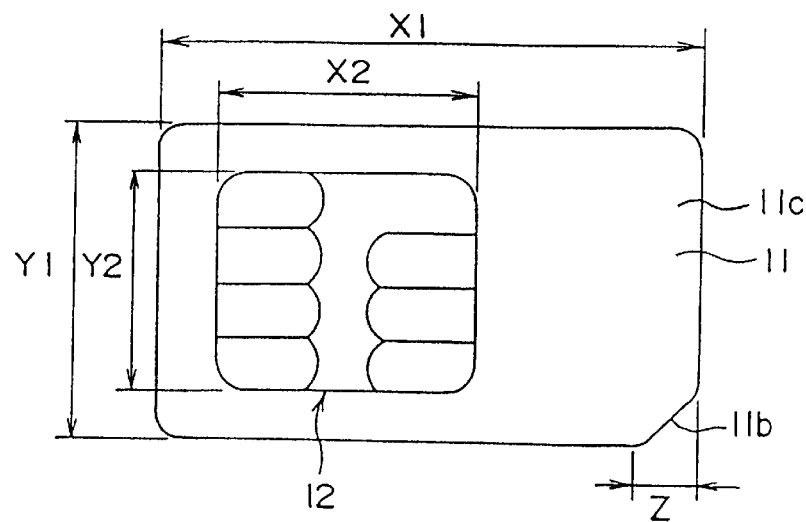
FIG. 16 is a plan view to show an IC carrier in the third embodiment.

The third embodiment of the present invention will be described referring to the drawings. FIGS. 15A, 15B, 15C, and 15D are drawings to show a sheet-framed IC carrier according to the present invention. FIG. 15A is a top plan view, FIG. 15B is a cross section along line 15—15 in FIG. 15A, FIG. 15C is a side view of FIG. 15A, and FIG. 15D is a bottom plan view. FIG. 16 is a plan view to show an embodiment of an IC carrier 11 in FIGS. 15A–15D. In the present embodiment the sheet-framed IC carrier 10 is mainly composed of an IC carrier 11, a sheet frame 13, and a backing film 16.

The sheet frame 13 is a resin sheet, for example, of polyvinyl chloride, which has an aperture 13a in a partial region.

The backing film 16 has a pressure-sensitive adhesive layer 16a, which is put on the back surface of sheet frame 13 to cover the back side of aperture 13a. The backing film 16 has a shape, preferably, either the same as or a little (about 2 mm) smaller than the outer shape of sheet frame 13. The thickness of backing film 16 is in the range of 80 to 200 $\mu$m, preferably about 100 $\mu$m. A preferable thickness range of adhesive layer 16a is about 20 to 23 $\mu$m. Such thickness ranges can provide the backing film 16 with strength sufficient to secure IC carrier 11 and give no hindrance in using the existing production facilities.

The IC carrier 11 is fit in the aperture 13a in sheet frame 13 with peripheral slit 14 at an appropriate gap, where the IC carrier 11 is fixed through the adhesive layer 16a on the backing film 16 on the back surface. The adhesive layer 16a has such tackiness that it loses the tackiness once peeled off after first adhesion.

The backing film 16 has a film slit 16b outside the region covering the aperture 13a. The slit 16b is preferably formed at a position, for example, about 8 mm outside from the peripheral edge of IC carrier 11. This film slit 16b permits a portion 16c adhering to the region covering the aperture 13a (hereinafter referred to as "segment 16c") to be separated from the backing film 16. The IC carrier 11 is secured with the segment 16c.

Figure 17:
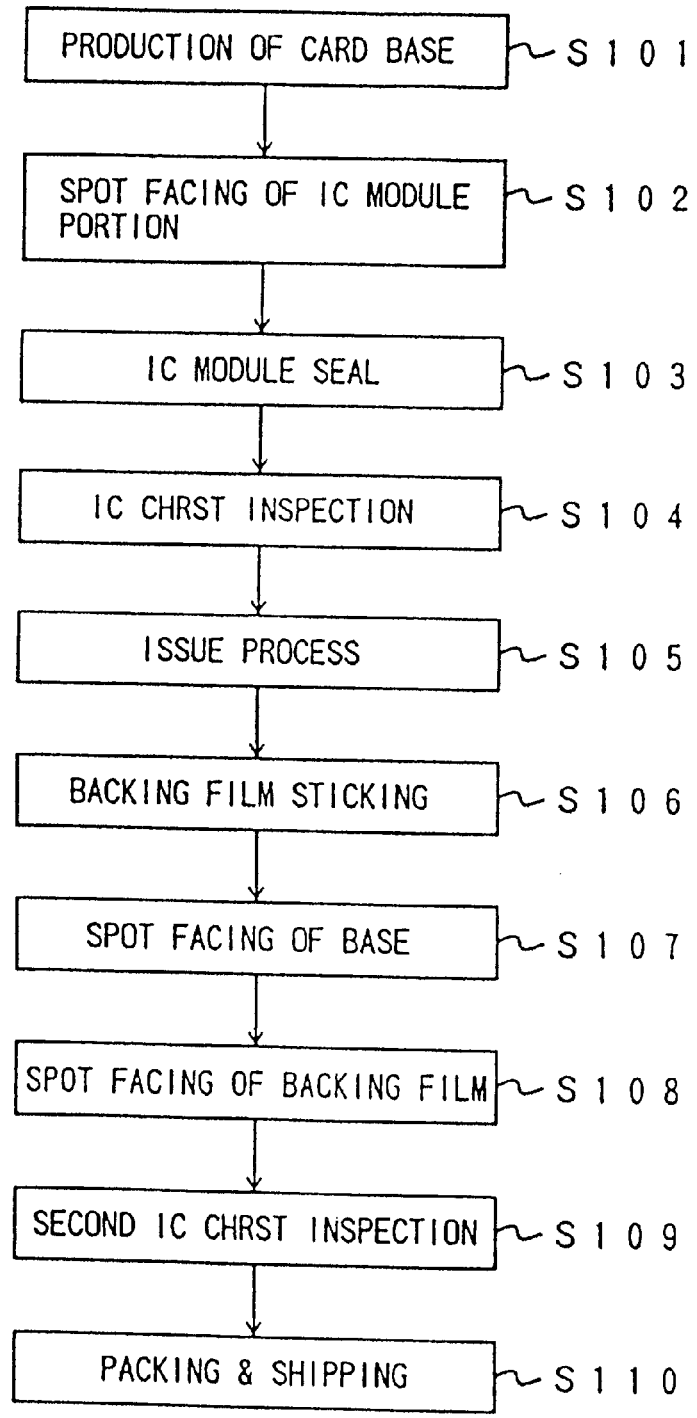
FIG. 17 is a process drawing to show a method for producing the sheet-framed IC carrier according to the present invention.

The IC carrier 11 is so arranged, as shown in FIG. 16, that an IC module 12 sized in the height Y2 of about 10.6 mm by the width X2 of about 12.0 mm is mounted on a resin base 11c sized in the height Y1 of about 15.00 mm by the width X1 of about 25.00 mm and that a cut 11b of about 3.00 mm is formed at a corner as Z for positioning in mounting it into a selected device. A method for producing the sheet-framed IC carrier is next described referring to FIG. 17. FIG. 17 is a process diagram to show an embodiment of the method for producing the sheet-framed IC carrier according to the present invention.

In FIG. 17, a card base 13 is first produced according to the ordinary method for producing plastic cards (step 101) and an IC module portion spot-facing step is carried out to form a mount recess 11a for IC module 12 using a spot-facing machine (step 102). Then the IC module 12 is set in the mount recess 11a and is fixed there by a module sealer, performing a module seal step (step 103).

An inspection step is next carried out to inspect characteristics or performance of the IC (step 104). Then an issue step is carried out to write data according to the purpose of IC carrier 11 (step 105). The above steps are the same as those in the ordinary method for producing IC cards.

A backing film 16 is next adhered to the back surface of card base 13 (step 106) and thereafter, using the spot-facing machine, a spot-facing step is carried out to form a peripheral slit 14 by cutting and removing a portion corresponding to the peripheral edge of IC carrier 11 in the form of groove (step 107). A further spot-facing step is carried out to form a film slit 16b by cutting and removing the backing film 16 outside the region over aperture 13a in the form of a groove (step 108).

Here, the cutting at step 107 may be such that only the card base is cut, such that the adhesive layer 16a on the backing film 16 is also cut, or such that even a part of backing film 16 is also cut within the range not to completely cut through the backing film 16.

Also, the cutting at step 108 may be such that the backing film 16 and adhesive layer 16a are cut or such that even a part of the card base is cut without completely cutting through the card base 13.

The order of step 107 and step 108 may be reversed.

A secondary IC inspection step is carried out to inspect characteristics or performance of IC after the spot-facing processes at above steps 107 and 108 (step 109). This step can be omitted as long as the processes at steps 107 and 108 cause no damage on IC module 12. After that, the sheet-framed IC carrier 10 is set in a slit mount and is enclosed and sealed in an envelope, performing a packing and shipping step (step 110).

Using the conventional IC card production facilities as described, it is easy to perform the various inspection steps (steps 104 and 109) and the packing and shipping step including the enclosing operation into the envelope (step 110), hard with IC carrier 11 alone, and the sufficient machining accuracy can be assured.

A user receiving the sheet-framed IC carrier 10 peels off the segment 16c in the backing film 16 from the sheet frame 13. The segment 16c is peeled off with IC carrier 11 adhering thereto. Then the user peels off the IC carrier 11 from the segment 16c and mounts IC carrier 11 into a mount portion in a selected device.

Accordingly, the IC carrier 11 is merely peeled off from the segment 16c. In this peeling step, the segment 16c is peeled off holding IC carrier 11. Thus, the segment can be peeled off with little load on IC carrier 11. This can prevent IC module 12 from being broken or popping out when removing IC carrier 11. The adhesive layer 16a on the backing film 16 has weak tackiness, so that the adhesive rarely remains on the back surface of IC carrier 11 after the removal thereof.

Employing the removing method according to the present embodiment, the segment 16c in the backing film 16 is first peeled off together with IC carrier 11, which does not require a wide width of peripheral slit 14. The spot-facing process for forming the film slit 16b in backing film 16 can be made with a very small cutting amount and within a short time. Accordingly, the time for the both spot-facing processes of peripheral slit 14 and film slit 16b is very short, which permits the sheet-framed IC carrier 10 to be produced at a lower production cost.

Figure 18A:
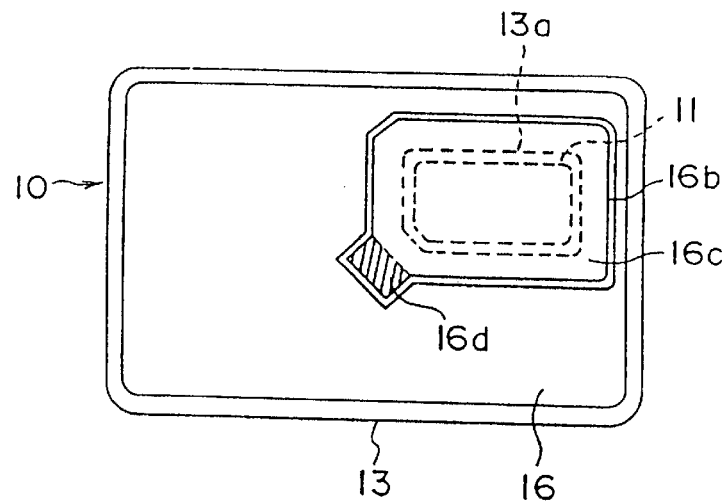
FIGS. 18A and 18B are bottom views to show modifications of the sheet-framed IC carrier according to the present invention.
Figure 18B:
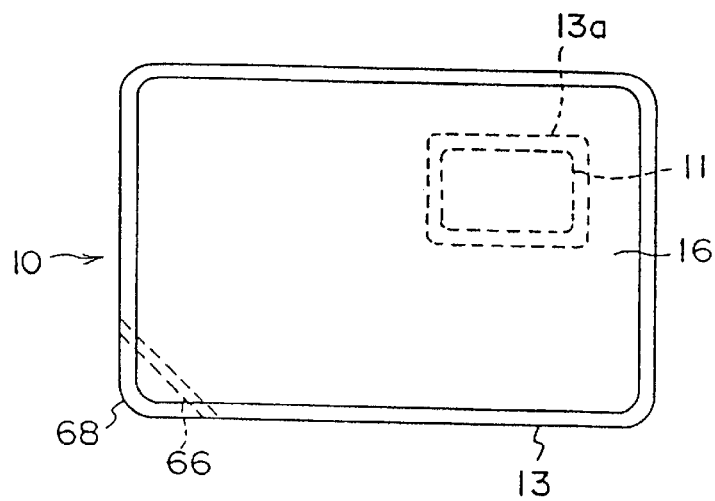

FIGS. 18A and 18B are bottom plan views to show further embodiments of the sheet-framed IC carrier according to the present invention. In FIGS. 18A and 18B, elements with the same functions as those in the embodiment shown in FIGS. 15A–15D are denoted by the same reference numerals, and redundant description will be omitted if appropriate.

A sheet-framed IC carrier 10 shown in FIG. 18A is so arranged that a backing film 16 is provided with a region 16d without pressure-sensitive adhesive layer 16a (which is a hatched region in FIG. 18A and which will be referred to as "non-adhesive region 16d") on a surface in contact with a sheet frame 13 and that a segment 16c includes the above non-adhesive region 16d in a region including a part of the peripheral edge thereof.

In forming a film slit 16b, a spot-facing process is performed so that the non-adhesive region 16d is located in the region including a part of the peripheral edge of segment 16c. It is noted that no trouble would occur with a little non-adhesive region 16d remaining on the backing film 16 other than the segment 16c.

With such sheet-framed IC carrier 10, the portion of non-adhesive region 16d can be pinched in peeling off the segment 16c from sheet frame 13, which further facilitates the peeling-off of segment 16c.

The embodiments of the present invention were described above. The present invention is not intended to be limited to the above embodiments, but may have various modifications within the range not departing from the essence thereof.

For example, the width of film slit 16b may be set equal to or wider than the width of peripheral slit 14 between IC carrier 11 and aperture 13a.

In the above embodiment the film slit 16b was formed to surround outside the region of aperture 13a in sheet frame 13 in backing film 16, but the slit is not limited to it. For example, the slit may be formed so as to separate a portion including a corner of backing film 16.

The above embodiment had the non-adhesive region 16d formed in the nearly central region of backing film 16, as shown in FIG. 18A, but the non-adhesive region may be defined in a region including a part of the peripheral edge of backing film 16. There is no specific restriction on the shape and the size of non-adhesive region 16d.

A modification is described referring to FIG. 18B. As shown in FIG. 18B, a frame slit 66 is provided on the top surface of corner portion 68 in sheet frame 13 (which is the back of FIG. 18B) so that the corner portion 68 can be freely separated from the sheet frame 13. Since the frame slit 66 is not completely through the sheet frame 13, the corner portion 68 is partly connected to sheet frame 13 on the side of backing film 16.

In FIG. 18B, the corner portion 68 is separated from the sheet frame at frame slit 66 whereby the backing film 16 is peeled off from the sheet frame 13 together with the corner portion 68. In this case, IC carrier 11 is bonded to the backing film 16. Then the IC carrier 11 is peeled off from the backing film 16, whereby the IC carrier 11 can be taken out of the sheet frame 13 without loading an excessive force on IC carrier 11.

Since the sheet-framed 1C carriers of the present invention are so arranged that a film slit is formed in the backing film and that the portion bonded to the region covering the aperture in the backing film is peeled off from the sheet frame with the IC carrier adhering thereto, the IC carrier can be taken out with little load on IC module. This can prevent the IC module from being broken or popping out when removing the IC carrier. Further, the IC carrier can be more easily taken out without a load thereon, because the non-adhesive region is provided in the backing film whereby the backing film can be peeled off with the IC carrier 11 while pinching the portion of non-adhesive region. Further, the production method of the sheet-framed IC carrier according to the present invention allows the production of IC carriers using the conventional IC card production facilities, which can reduce the production cost. Since the slit forming step can be done within a short time, the sheet-framed IC carrier according to the present invention can be produced at a low production cost.

Fourth Embodiment

The fourth embodiment of the present invention will be described referring to the drawings. FIGS. 19A, 19B thru FIGS. 22A, 22B are drawings to show further embodiments of the sheet-framed IC carrier according to the present invention. In the drawings, FIGS. 19A, 20A, 21A, 22A are plan views, and FIGS. 19B, 20B, 21B, 22B cross sections along B—B line in FIGS. 19A, 20A, 21A, 22A, respectively.

Figure 19A:
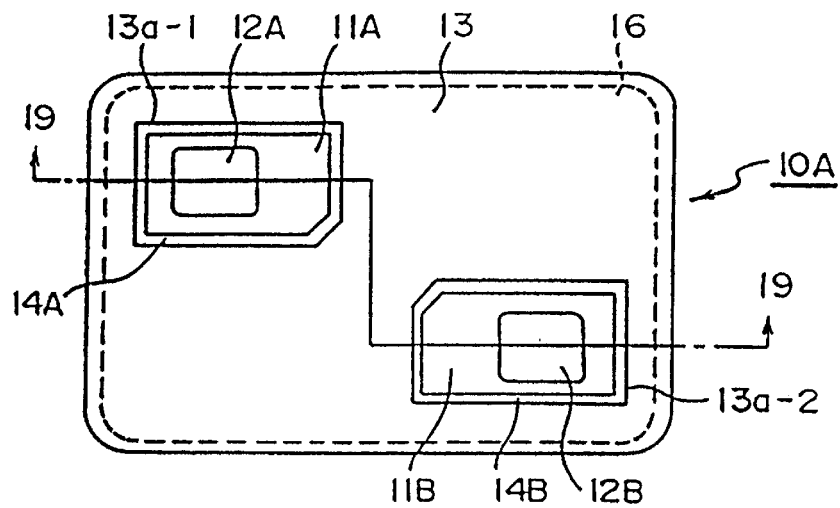
FIGS. 19A and 19B are drawings of a sheet-framed IC carrier to show a fourth embodiment of the present invention.
Figure 19B:
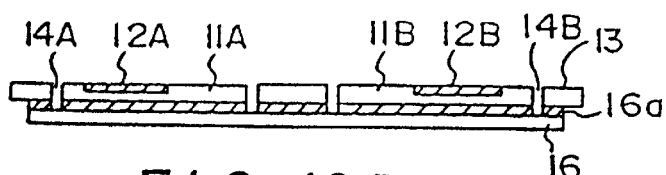

In FIGS. 19A and 19B, a sheet-framed IC carrier 10A is mainly composed of a plurality of (two) IC carriers 11A, 11B, a sheet frame 13, and a backing film 16. The sheet frame 13 is a resin sheet, for example, of polyvinyl chloride, which has a plurality of (two) apertures 13a-1, 13a-2 in partial regions.

The backing film 16 has a pressure-sensitive adhesive layer 16a, which is stuck on the back surface of sheet frame 13, covering the back side of apertures 13a-1, 13a-2. The backing film 16 has a size, preferably, either the same as or a little (about 2 mm) smaller than the outer shape of sheet frame 13. The thickness of backing film 16 is in the range of 80 to 200 μm, preferably about 100 μm. The thickness of adhesive layer 16a is preferably in the range of about 20 to 23 μm. Such thickness ranges can provide the backing film with strength sufficient to secure IC carriers 11A, 11B and give no hindrance in using the existing production facilities.

IC carriers 11A, 11B having IC modules 12A, 12B, in which common information is recorded, are set in the apertures 13a-1, 13a-2, respectively, in the sheet frame 13 and are secured there through the adhesive layer 16a on the backing film 16 on the back surface. The adhesive layer 16a has such tackiness that it loses its tackiness once peeled off after first adhesion. A peripheral slit 14A or 14B is provided at an appropriate gap between aperture 13a-1, 13a-2 and IC carrier 11A, 11B. The IC carriers 11A, 11B are arranged in point symmetry with each other in the sheet frame 13.

Figure 20A:
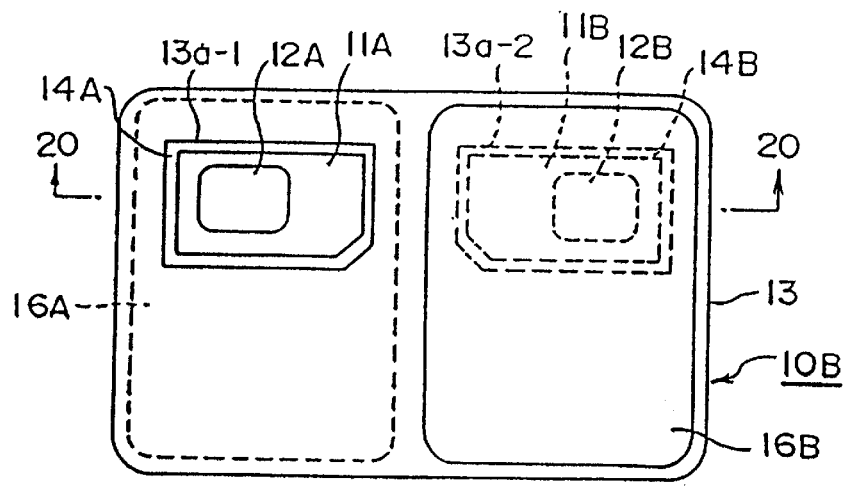
FIGS. 20A and 20B are drawings to show a modification of the present invention.
Figure 20B:
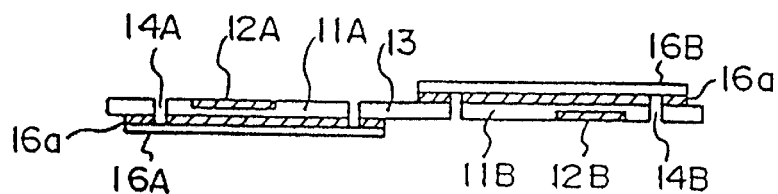

In the embodiment shown in FIGS. 20A and 20B, a sheet-framed IC carrier 10B has a backing film 16 composed of films 16A and 16B, which are stuck on two different surfaces of the sheet frame 13. In FIGS. 20A, 20B, the film 16A is stuck on a left region on the back surface of sheet frame 13 while the film 16B on a right region on the top surface of sheet frame 13. The films 16A, 16B cover the apertures 13a-1, 13a-2, respectively, formed in the sheet frame 13.

Each IC carrier 11A, 11B is so set as to be fixed through an adhesive layer 16a on film 16A, 16B. IC modules 12A, 12B in IC carriers 11A, 11B are mounted on different surfaces of sheet frame 13. The IC carriers 11A, 11B are arranged in line symmetry with each other in the sheet frame 13.

In the embodiment shown in FIGS. 21A and 21B, a sheet-framed IC carrier 10C is a modification of the sheet-framed IC carrier 10B shown in FIGS. 20A and 20B. This sheet-framed IC carrier 10C includes no backing film 16. IC carriers 11A, 11B are so arranged that they can be separated from sheet frame 13 through peripheral slits 17A, 17B grooved in the sheet frame 13 and a plurality of bridges 18A, 18B connecting between the sheet frame 13 and the IC carriers 11A, 11B. The other structure is the same as that of the sheet-framed IC carrier 10B.

In the embodiment shown in FIGS. 22A and 22B, a sheet-framed IC carrier 10D is a modification of the sheet-framed IC carrier 10A shown in FIGS. 19A and 19B. The sheet-framed IC carrier 10D has a backing film 16 composed of films 16A and 16B, which are stuck on a same surface (the back surface in this case). Namely, IC carrier 11A is secured with film 16A while IC carrier 11B with film 16B. The other structure is the same as that of the sheet-framed IC carrier 10A.

Figure 23:
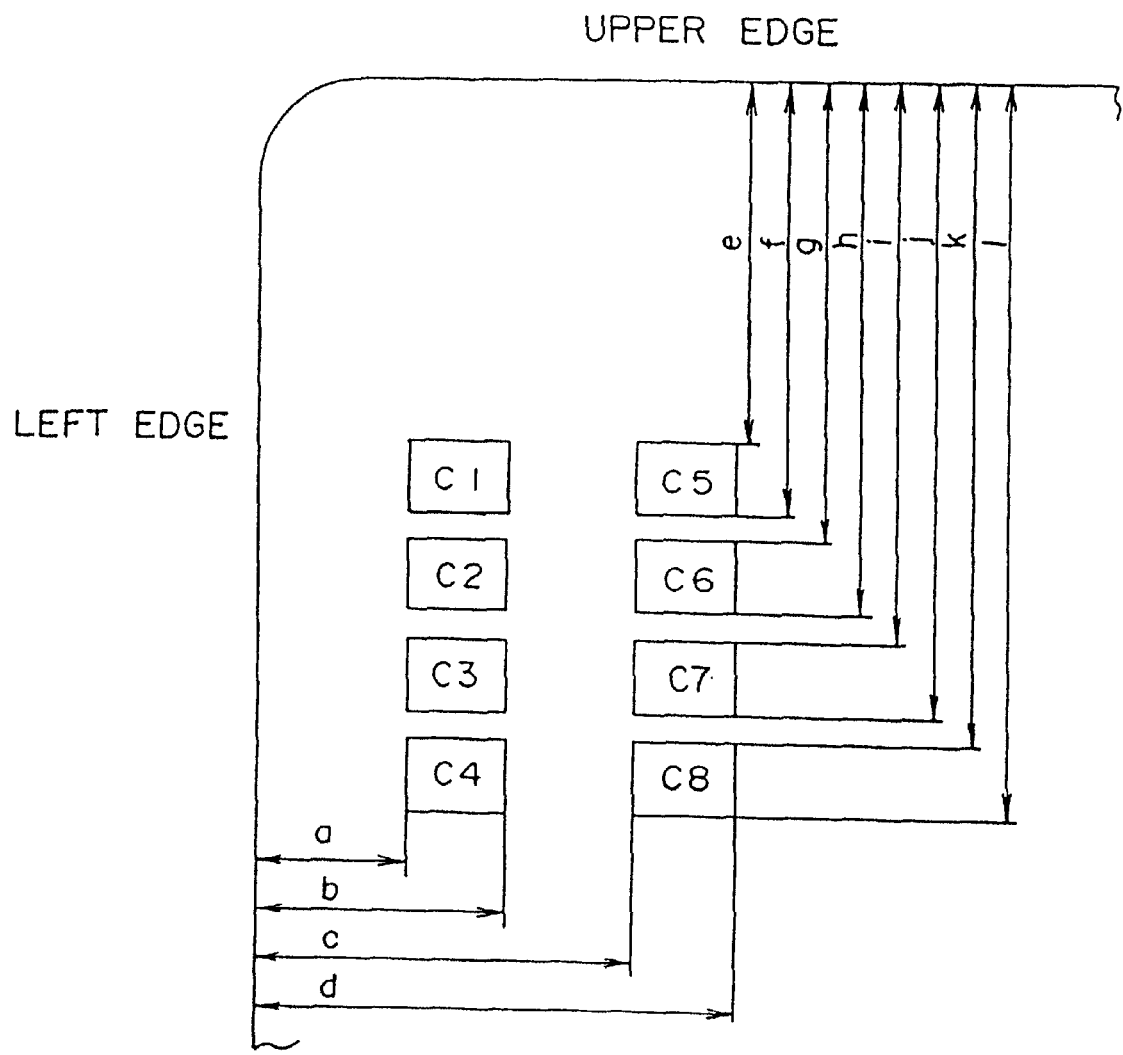
FIG. 23 is a plan view to show a detailed arrangement of terminals in an IC carrier according to the present invention.

FIG. 23 is a plan view to show a detailed arrangement of terminals for each IC carrier 11A, 11B in the present invention. There are eight terminals (C1 thru C8), which are rectangular. Further, the terminals are preferably located at positions compliant with ISO (which are terminal positions of IC module in an IC card compliant with ISO). In more detail, the positions are defined as follows from the left edge or the upper edge of card base (sheet frame 13) in FIG. 23: a 10.25 mm max; b 12.25 mm min; c 17.87 mm max; d 19.87 mm min; e 19.23 mm max; f 20.93 mm min; g 21.77 mm max; h 23.47 mm min; i 24.31 mm max; j. 26.01 mm min; k 26.85 mm max; l 28.55 mm min.

Employing the above arrangement, the IC carriers can be produced using the conventional IC card production facilities.

If a plurality of related IC carriers are produced, for example, if a plurality of telephones are used with a single contract, such as master and extension telephones, or if a set of mobile phone and portable phone are used, the IC carriers can be produced from a single card base using the sheet-framed IC carrier 10A–10D, thus reducing the used materials (card base). Since information can be quickly recorded in each IC module, the production time can be curtailed. Further, plural IC carriers can be handled in a single unit, which facilitates management thereof.

The embodiments of the present invention were described above. It should, however, be noted that the present invention is not intended to be limited to the above embodiments but may have various modifications within the range not departing from the essence thereof. For example, surfaces of terminals of IC modules 12 may be set on a same plane or on different planes of sheet frame 13, as shown in FIGS. 19A, 19B thru FIGS. 22A, 22B. The embodiments showed the examples in which two IC carriers 11 were provided in the sheet frame 13, but the number of IC carriers 11 is not limited to two. For example, three or more IC carriers may be provided. According to the present invention, a plurality of related IC carriers can be produced from a single sheet frame (base), which can reduce the used materials. Also, information can be quickly recorded in each IC module, curtailing the production time. This permits rationalization of production.

Further, a plurality of IC carriers can be handled in a single unit, which facilitates the management. In addition, the positions of terminals of each IC carrier are located at positions compliant with ISO, so that they can be produced using the conventional IC card production facilities.

Fifth Embodiment

The fifth embodiment of the present invention will be described referring to the drawings.

Figure 24A:
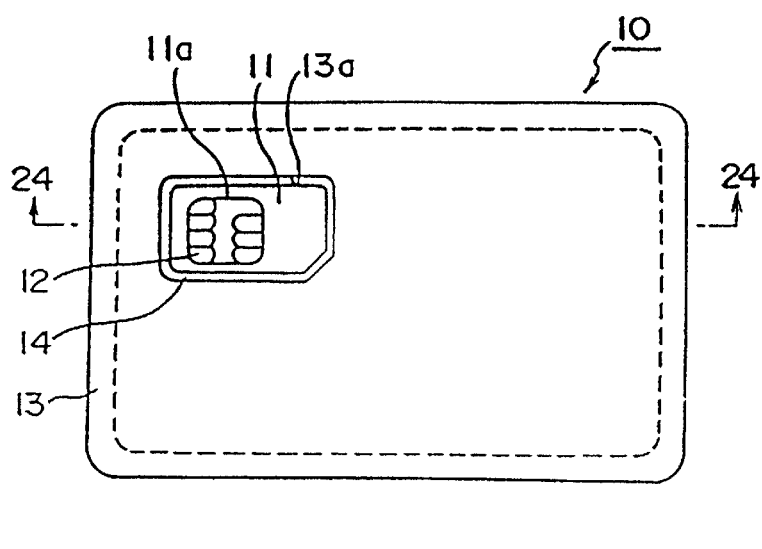
FIGS. 24A, 24B, and 24C are drawings of a sheet-framed IC carrier to show a fifth embodiment of the present invention.
Figure 24C:
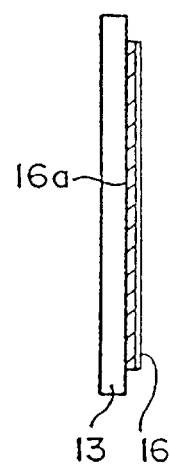
Figure 24B:
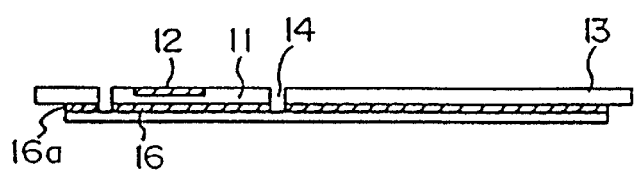
Figure 25:
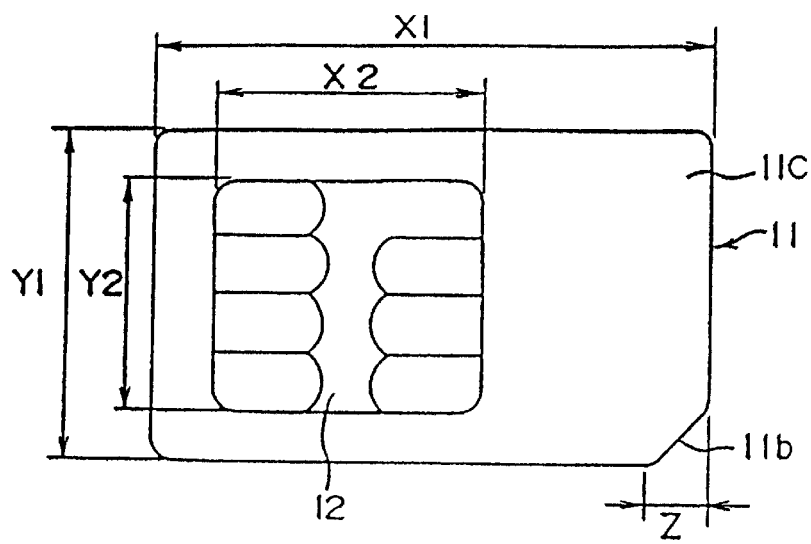
FIG. 25 is a drawing to show an IC carrier in the fifth embodiment.

FIGS. 24A–24C are drawings to show a sheet-framed IC carrier according to the present invention. FIG. 24A is a plan view, FIG. 24B a cross sectional view along line 24–24 in FIG. 24A, and FIG. 24C a side view of FIG. 24A. FIG. 25 is a drawing to show an embodiment of IC carrier. In the present embodiment, a sheet-framed IC carrier 10 is mainly composed of an IC carrier 11, a sheet frame 13, and a backing film 16. The sheet frame 13 is a resin sheet, for example, of polyvinyl chloride, which has an aperture 13a in a partial region.

The backing film 16 has a pressure-sensitive adhesive layer 16a, which is stuck on the back surface of sheet frame 13, covering the back side of aperture 13a. The backing film 16 has a size, preferably, either thee same as or a little (about 2 mm) smaller than the outer shape of sheet frame 13. The thickness of backing film 16 is in the range of 80 to 200 μm, preferably about 100 μm. A material for the backing film 16 is one having a surface with large friction and having flexibility. Specifically, the material may be one selected from polyvinyl chloride (PVC) resins and polyolefin (PO) resins. Among them, polyethylene-based resins are particularly preferable because of its properties, for example, low static electricity, low frictional heat, excellent thermal resistance, and excellent weather resistance.

Further, the following advantages may be enjoyed if the backing film 16 is made of a polyethylene-based resin.

Generally, the polyvinyl chloride resins are excellent in mechanical properties and chemical resistance, but inferior in fluidity in process and low in thermal stability. Therefore, they are used with a plasticizer such as dioctyl phthalate. A hard polyvinyl chloride resin used for sheet frame 13 includes a small amount of added plasticizer (for example, 0 thru 5%) but a soft polyvinyl chloride resin includes a large amount of added plasticizer (30 thru 50%). If the backing film 16 is made of a soft polyvinyl chloride resin, the added plasticizer migrates into the sheet frame 13, which is apt to affect the surface of sheet frame 13. Once the surface of sheet frame 13 is affected, information printed on the surface would be blurred.

In contrast, the polyethylene-based resins include no plasticizer, thus having no migration thereof. Use of the polyethylene resins can prevent the surface of sheet frame 13 from being affected.

A preferable thickness range of adhesive layer 16a is about 20 to 23 μm. Determining the thickness ranges of backing film 16 and adhesive layer 16a as described above, they have strength sufficient to secure IC carrier 11 and show no hindrance in using the existing production facilities.

An IC carrier 11 having IC module 12 is fit in an aperture 13a in sheet frame 13, where the IC carrier 11 is secured with the adhesive layer 16a on the backing film 16 on the back surface. The adhesive layer 16a has such weak tackiness that it loses the tackiness once peeled off after first adhesion. A peripheral slit 14 is provided at an appropriate gap between aperture 13a and IC carrier 11.

The IC carrier 11 is so arranged, as shown in FIG. 25, that an IC carrier 12 sized in the height Y2 of about 10.6 mm by the width X2 of about 12.0 mm is mounted on a resin base 11c sized in the height Y1 of about 15.00 mm by the width X1 of about 25.00 mm and that a cut 11b of about 3.00 mm is formed at a corner as Z for positioning in mounting the carrier into a selected device.

A method for producing the sheet-framed IC carrier 10 is briefly described in the following.

A card base 13 is first produced according to the ordinary method for producing plastic cards, and a recess 11a in which IC module 12 is set is formed in the card base 13. Then the IC module 12 is mounted in the recess 11a.

Subsequently, an inspection step is carried out to inspect characteristics or performance of the IC, and an issue step is next conducted to write data according to the purpose of the IC carrier 11. The above steps are the same as those in the ordinary IC card production method.

After the backing film 16 is put on the back surface of card base, a peripheral slit 14 is formed by cutting and removing a portion corresponding to the peripheral edge of the IC carrier 11 in the form of a groove.

Then characteristics of IC are inspected with necessity after the formation of peripheral slit 14. Finally, the sheet-framed IC carrier 10 is set in a slit mount, and the mount with IC carrier 10 is enclosed and sealed in an envelope, thus performing a packing and shipping process.

Using the conventional IC card production facilities as described above, it is easy to perform the various inspections and the packing and shipping process including the enclosing operation into the envelope, and sufficient machining accuracy can be assured.

In the enclosing and sealing step, the sheet-framed IC carrier 10 is carried into a matching inserter (enclosing and sealing machine). On this occasion, the sheet-framed IC carrier 10 is conveyed by a conveying portion such as a convey roller or a convey belt in the apparatus. Since the backing film 16 on the sheet-framed IC carrier 10 is made of the polyethylene resin as described above, a frictional force is large on the contact surfaces between the sheet-framed IC carrier 10 and the convey roller or the like. Accordingly, no slip occurs between the contact surfaces. In other words, the sheet-framed IC carrier 10 can be positively conveyed without slip of convey roller or the like, thus preventing a conveyance error of the sheet-framed IC carrier 10 and smoothly performing the enclosing and sealing operation. This can prevent a predetermined envelope without sheet-framed IC carrier 10 therein from being sent to a user.

A user receiving the sheet-framed IC carrier 10 pushes the bottom of IC carrier 11 through the backing film 16 on the back surface side and peels off the IC carrier 11 from backing film 16 to take off IC carrier 11. On this occasion the user can readily push the IC carrier 11, because the backing film 16 has flexibility. Further, the IC carrier 11 is merely peeled off from the backing film 16, which can prevent an excessive load from being exerted on IC module 12 and which can prevent IC module 12 from being broken or from popping out of the IC carrier 11.

The IC carrier 11 thus peeled off is set in a mount portion in a selected device. Since there is no projection remaining on the peripheral edge of the IC carrier 11, a difference from the conventional case, the IC carrier 11 can be positively set in the mount portion in the selected device.

The embodiment of the present invention was described above. It should, however, be noted that the present invention is not intended to be limited to the above-described embodiment, but may have various modifications within the range not departing from the essence thereof. For example, in order to increase a real contact area of the contact surface of backing film 16 with the conveying portion in the enclosing and sealing apparatus, the surface of backing film 16 may be luster-surface-finished in accordance with necessity. As so formed, the contact surface can further increase the frictional force.

Since the sheet-framed IC carrier according to the present invention has the increased frictional force on the contact surfaces between the backing film and the conveying portion in the conveying apparatus, the sheet-framed IC carrier can be smoothly conveyed in the apparatus without occurrence of slip on the contact surfaces. This can prevent such a conveyance error or operation error that a sheet-framed IC carrier is not enclosed in a predetermined envelope. Also, the production efficiency can be increased. Because the backing film is made of a polyethylene resin, no migration of plasticizer occurs into the sheet frame, thus preventing the surface of sheet frame from being affected and enhancing the shelf stability of sheet frame.

Sixth Embodiment

The sixth embodiment of the present invention will be described referring to the drawings.

Figure 26A:
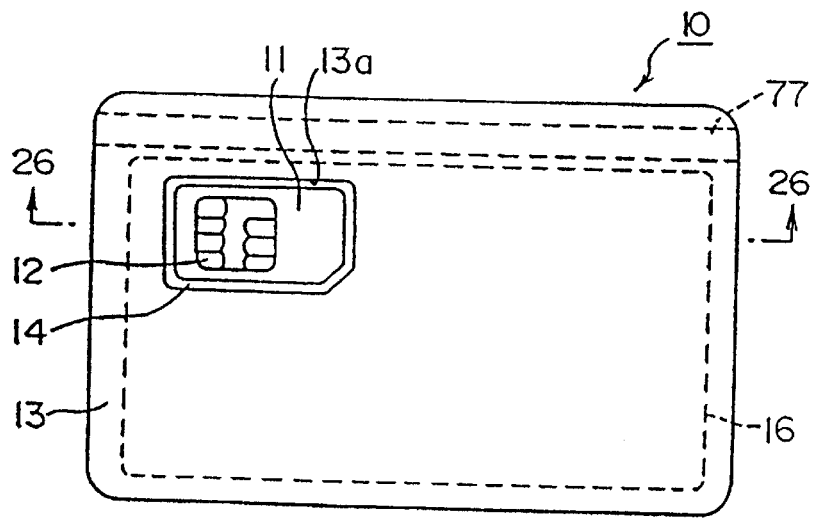
FIGS. 26A and 26B are drawings of a sheet-framed IC carrier to show a sixth embodiment of the present invention.
Figure 26B:
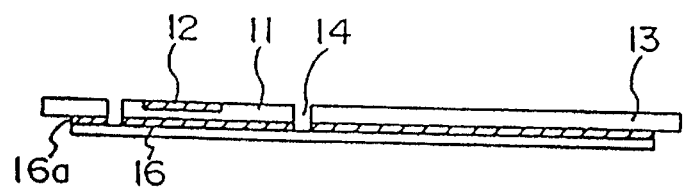
Figure 27:
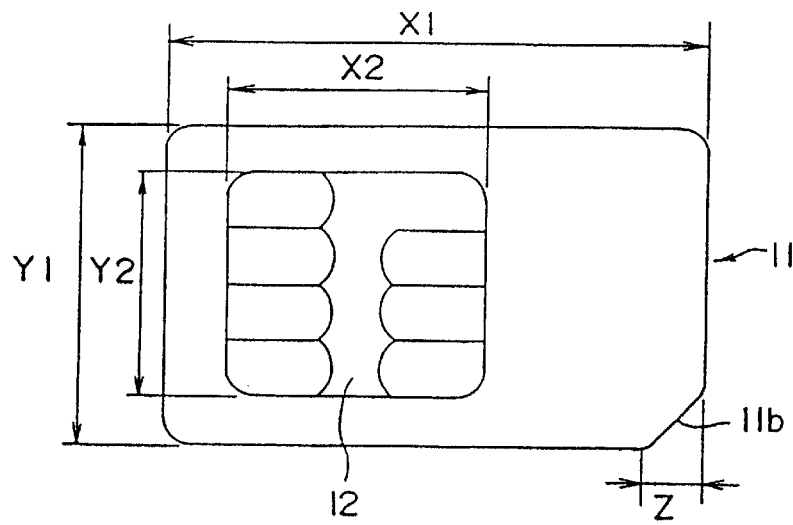
FIG. 27 is a drawing to show an IC carrier in the sixth embodiment.

FIGS. 26A and 26B are drawings to show a sheet-framed IC carrier according to the present invention. FIG. 26A is a plan view and FIG. 26B a cross section along line 26—26 in FIG. 26A. FIG. 27 is a drawing to show an embodiment of IC carrier.

In the present embodiment a sheet-framed IC carrier 10 is mainly composed of an IC carrier 11, a sheet frame 13, and a backing film 16. The sheet frame 13 is a resin sheet, for example, of polyvinyl chloride, which has an aperture 13a in a partial region.

The backing film 16 has a pressure-sensitive adhesive layer 16a, which is adhered to the back surface of sheet-frame 13, covering the back side of aperture 13a. The thickness of backing film 16 is in the range of 80 to 200 $\mu$m, preferably about 100 $\mu$m. A preferable range of adhesive layer 16a is about 20 to 23 $\mu$m. Such thickness ranges assure strength sufficient to secure IC carrier 11 and cause no hindrance in using the existing production facilities.

An IC carrier 11 having an IC module 12 is fit in the aperture 13a in the sheet frame 13, where the IC carrier 11 is secured with adhesive layer 16a on the backing film 16 on the back surface. The adhesive layer 16a has such weak tackiness that it loses the tackiness once peeled off after first adhesion. A peripheral slit 14 is formed at an appropriate gap between aperture 13a and IC carrier 11.

The IC carrier 11 is so arranged, as shown in FIG. 27, that an IC carrier 12 sized in the height Y2 of about 10.6 mm by the width X2 of about 12.0 mm is mounted on a resin base sized in the height Y1 of about 15.00 mm by the width X1 of about 25.00 mm and that a cut 11b of about 3.00 mm is formed at a corner as Z for positioning in mounting the IC carrier 11 into a selected device.

Figure 28:
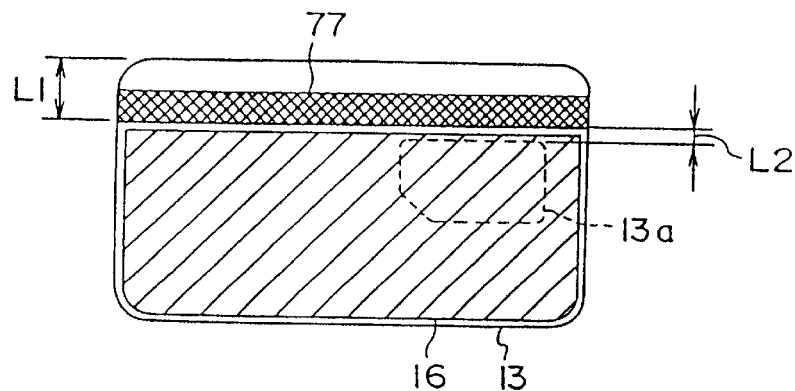
FIG. 28 is a bottom view of a sheet-framed IC carrier.
Figure 29:
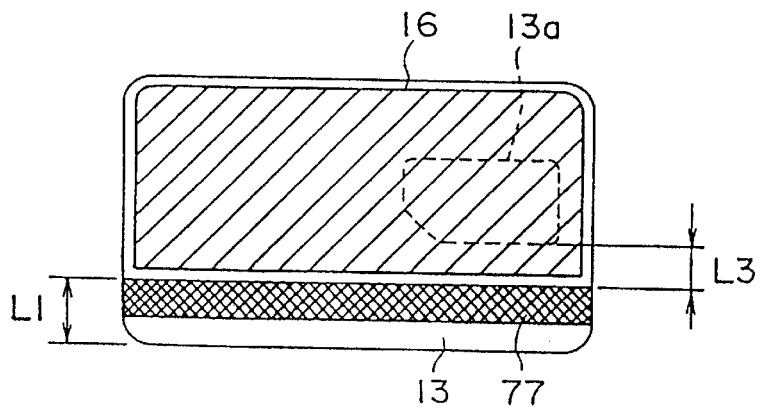
FIG. 29 is a bottom view to show a modification of the sheet-framed IC carrier.

FIG. 28 is a bottom view of the sheet-framed IC carrier 10 of FIG. 26, and FIG. 29 is a bottom view to show another embodiment of the sheet-framed IC carrier 10.

In FIG. 28, a magnetic stripe 77 is formed on the back surface of sheet frame 13. The magnetic stripe 77 is an information recording portion for recording coded information therein in the mechanically readable form, which is formed by a conventionally known method, for example, by the magnetic layer transfer method. The magnetic layer transfer method is such a method that a transfer tape is produced by successively depositing a release layer, a protection layer, a magnetic layer, and a heat-sensitive adhesive layer on a PET film of about 20 $\mu$m and heat-pressing the transfer tape onto the sheet frame 13 to transfer a magnetic stripe 77 onto the sheet frame 13.

Further, the magnetic stripe 77 is located at a position compliant with ISO standard, so that the distance from the upper edge of sheet frame 13 is a predetermined distance L1. Also, the positions of terminals of IC module 12 are compliant with ISO standard. This leaves a clearance of L2 as shown in FIG. 28 between the lower edge of magnetic stripe 77 and the upper edge of aperture 13a in sheet frame 13. The backing film 16 is put on the back surface so that the upper edge thereof is located in the clearance. Putting the backing film 16 on the back surface, as described above, the backing film 16 covers the region over the aperture 13a in sheet frame 13 and the magnetic stripe 77 remains exposed after adhesion of backing film 16.

Accordingly, the information recorded in the magnetic stripe 77 can be read through a magnetic reader compliant with ISO standards after the backing film 16 is adhered to the back face.

The magnetic stripe 77 includes recorded information, for example, information concerning the user of the IC carrier 11 or information concerning recorded information in IC module 12. This allows the recorded information to be read for matching in the production process of sheet-framed IC carrier 10.

In the embodiment of FIG. 29, the magnetic stripe 77 is located at a position symmetric with the position compliant with ISO standard, so that the distance from the lower edge of sheet frame 13 is L1. This arrangement leaves a clearance of L3 as shown between aperture 13*a* in sheet frame 13 and magnetic stripe 77. The distance L3 is longer than the distance L2 in FIG. 28. Backing film 16 is put on the back surface in such a manner that it covers the region over the aperture 13*a* and the region except for the region of magnetic stripe 77, similarly as in the embodiment of FIG. 28. Thus, the backing film 16 can be put on the back surface more easily. Further, the magnetic stripe 77 can be read through a magnetic reader compliant with ISO standards, because the distance L1 between one edge of sheet frame 13 and the magnetic stripe 77 is compliant with ISO standards.

The embodiments of the present invention were described above. It should, however, be noted that the present invention is not intended to be limited to the above embodiments, but may have various modifications within the range not departing from the essence thereof. For example, the above embodiments employed the magnetic stripe 77 as an embodiment of the information recording portion, but the information recording portion is not limited to the magnetic stripe but may be a bar code or optically readable characters. Further, the information recording portion may be a combination of the magnetic stripe 77 with a bar code or optically readable characters.

With the sheet-framed IC carrier according to the present invention, the information in the information recording portion can be mechanically read after the backing film is put on the back surface. This arrangement allows matching between information recorded in the information recording portion and information recorded in IC module during the production steps of sheet-framed IC carrier, which enhances the production efficiency. Arranging the information recording portion as a magnetic stripe, the sheet-framed IC carrier can be produced in the same manner as the magnetic stripe IC cards.

Seventh Embodiment

Figure 30A:
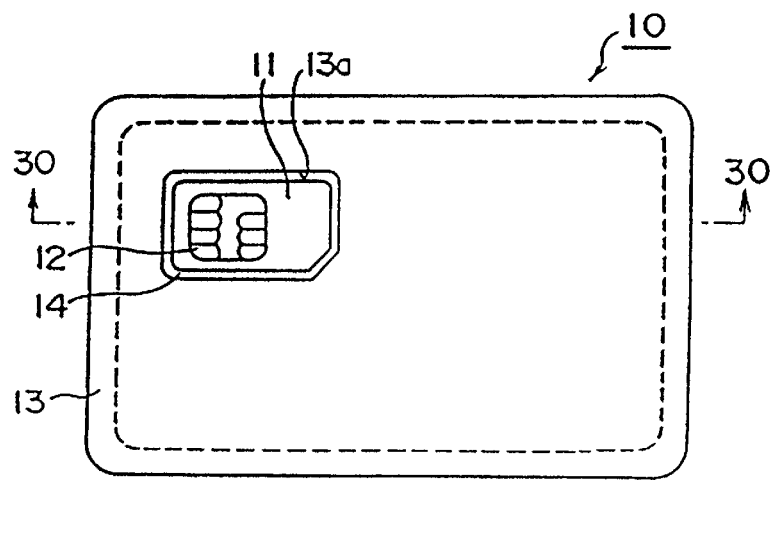
FIGS. 30A, 30B, and 30C are drawings of a sheet-framed IC carrier to show a seventh embodiment of the present invention.
Figure 30C:
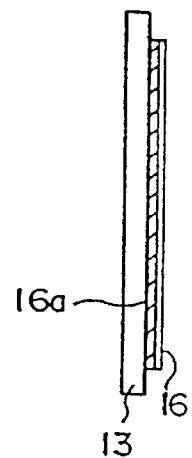
Figure 30B:
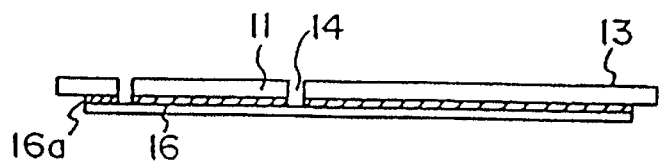
Figure 31A:
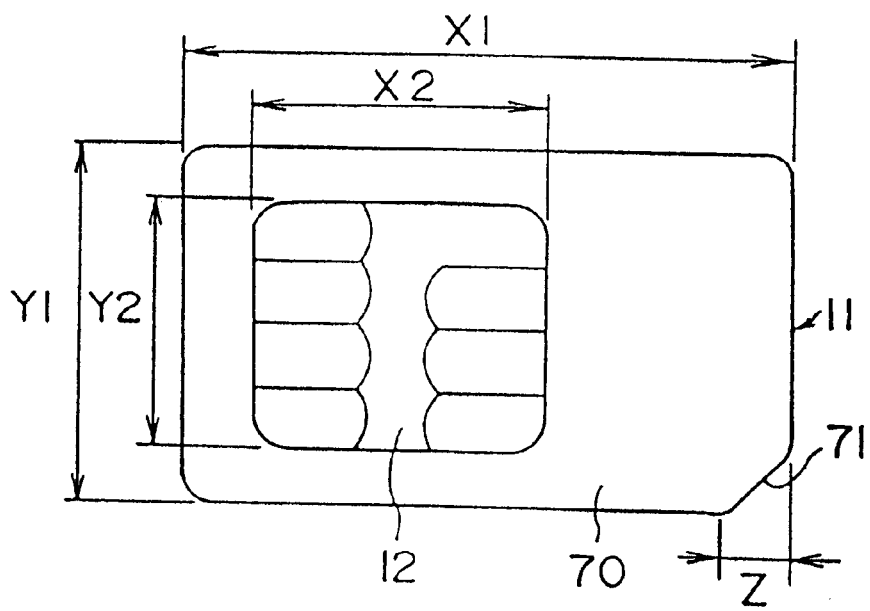
FIGS. 31A and 31B are a plan view and a side view to show an IC carrier in the seventh embodiment.

The seventh embodiment of the present invention will be described referring to the drawings. FIGS. 30A, 30B, and 30C are drawings to show an embodiment of the sheet-framed IC carrier according to the present invention. FIG. 30A is a plan view, FIG. 30B a cross section along line 30—30 in FIG. 30A, and FIG. 30C a side view of FIG. 30A. Also, FIG. 31A is a plan view of IC carrier 11 and FIG. 31B a side cross section thereof. In the present embodiment, a sheet-framed IC carrier 10 is mainly composed of an IC carrier 11, a sheet frame 13, and a backing film 16.

The sheet frame 13 is made of a material selected from PVC, glass epoxy, and a cardboard, which has an aperture 13*a* in a partial region.

The backing film 16 has a pressure-sensitive adhesive layer 16*a*, which is adhered to the back surface of sheet frame 13, covering the back side of aperture 13*a*. The backing film 16 has a size, preferably, either the same as or a little (about 2 mm) smaller than the outer shape of sheet frame 13. The thickness of backing film 16 is in the range of 80 to 200 $\mu$m, preferably about 100 $\mu$pm. A preferable thickness range of adhesive layer 16*a* is about 20 to 23 $\mu$m. Such thickness ranges assure the strength sufficient to secure the IC carrier 11 and causes no hindrance in using existing production facilities.

An IC carrier 11 is set in the aperture 13*a* in sheet frame 13 with an appropriate gap of peripheral slit 14, where the IC carrier 11 is secured with the adhesive layer 16*a* on the backing film 16 on the back surface. The adhesive layer 16*a* has such weak tackiness that it loses the tackiness once peeled off after first adhesion.

Figure 31B:
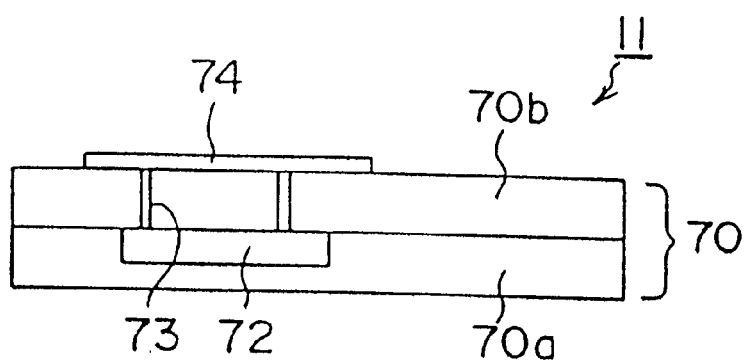

The IC carrier 11 is formed as an IC module itself. Namely, the IC carrier 11 is equivalent in shape and size to the IC module. As shown in FIG. 31A and 31B, the IC carrier 11, i.e., the IC module, is composed of a base 70 in which a resin 70*a* and a print base 70*b* are laminated, an IC chip 72 set in the base 70, and an external contact terminal 74 exposed to the outside as electrically connected to IC chip 72 by through holes 73.

The IC carrier 11 is formed to comply with the shape of SIM in the GSM 11.11 standard. Namely, the base 70 is formed in the size of the height Y1 of about 15.00 mm by the width X1 of about 25.00 mm, the external contact terminal 73 is formed in the size of the height Y2 of about 10.6 mm by the width X2 of about 12.0 mm, and a cut 71 of about 3.00 mm is formed at a corner as Z for positioning in mounting the IC carrier in a selected device.

Figure 32:
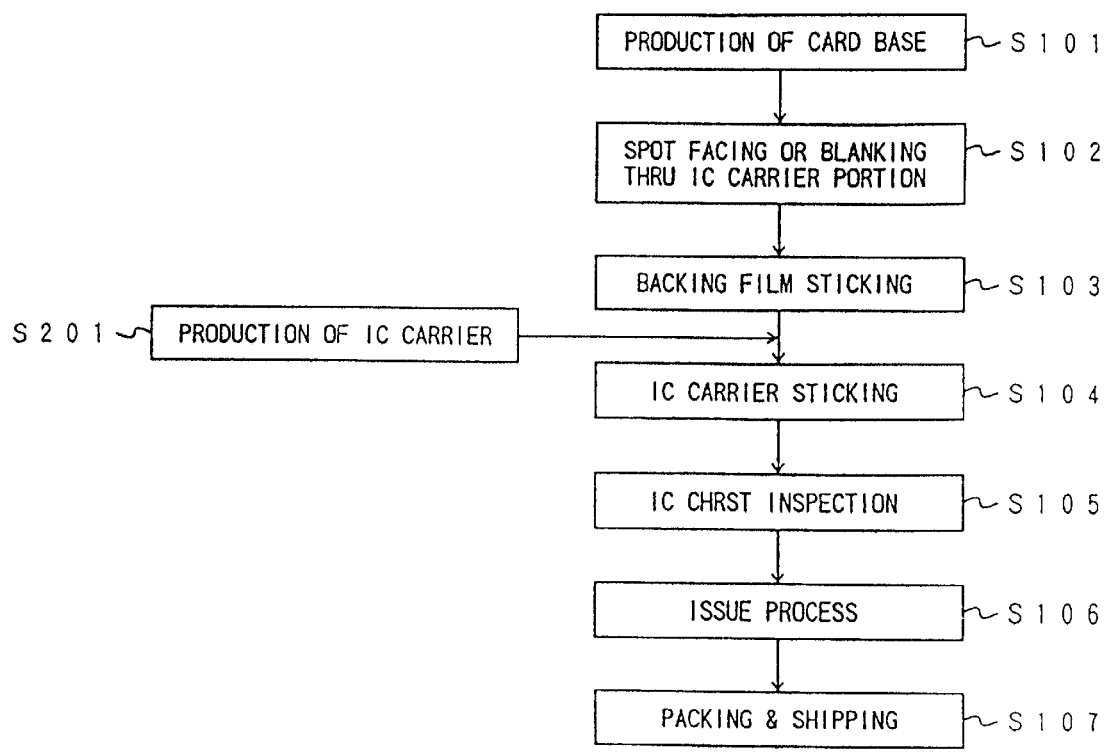
FIG. 32 is a process drawing to show a method for producing the sheet-framed IC carrier according to the present invention.

A method for producing the sheet-framed IC carrier is next described referring to FIG. 32. FIG. 32 is a process diagram to show an embodiment of the method for producing the sheet-framed IC carrier according to the present invention.

A card base is first produced according to the ordinary plastic card production method, as shown in FIG. 32, (step 101), and using a spot-facing machine or a press machine, a spot-facing or blanking step is carried out to form an aperture 13*a* for IC carrier 11 to be set therein (step 102). The aperture 13*a* is formed in such a size that a peripheral slit 14 of an appropriate gap is left around the IC carrier 11 when the IC carrier 11 is set in the aperture 13*a*. The backing film 16 is next put on the back surface of card base (step 103).

On the other hand, the IC carrier 11 shown in FIGS. 31A and 31B is produced at step 201 in a separate flow from steps 101 through 103. Then the IC carrier 11 is set in the aperture 13*a*, where it is secured with the adhesive layer 16*a* on the backing film 16, thus performing a sticking step of IC carrier 11 (step 104). An inspection step is next conducted to inspect characteristics or performance of IC (step 105) and an issue process is then carried out to write data according to the purpose of IC carrier 11 (step 106). After that, the sheet-framed IC carrier 10 is set in a slit mount, and the mount with IC carrier 10 is enclosed and sealed in an envelope, thus performing a packing and shipping step (step 107).

In the above production method the IC carrier 11 is COB (Chip On Board: IC module with IC chip below a printed circuit board), which can reduce the production cost. Namely, the process excludes the spot-facing step for forming an IC module mounting recess in the card base and the module seal step for mounting the IC module in the recess, as in the conventional cases, but includes a spot-facing (or blanking) step for forming the aperture 13*a* (step 102) and the sticking step of IC carrier 11 (step 104), so that the process does not need the spot-facing step after the mounting of IC module and the inspection step of IC characteristics after the spot-facing step, which can considerably reduce the production time.

Further, because the IC carrier 11 is produced in a different flow from the flow of sheet frame 13 (card base), the material for sheet frame 13 does not always have to be the same as the material for base 70 of IC carrier 11. Since the sheet frame 13 becomes unnecessary after the IC carrier 11 is taken out, any material can be employed so long as it is appropriate for a reader-writer (issuing apparatus). For example, use of cardboard permits the sheet frame to be formed at low cost.

Since the IC carrier 11 is set in the sheet frame 13, it is easy in the above process, using the conventional IC card production facilities, to perform the inspection step of characteristics or performance of IC (step 105) and the packing and shipping step including the enclosing operation into an envelope (step 107), which is difficult with IC carrier 11 alone. Furthermore, sufficient machining accuracy can be assured.

A user receiving the sheet-framed IC carrier 10 peels off the IC carrier 11 from the sheet frame 13 and mounts it in a mount portion in a selected device. On this occasion, the IC carrier 11 is merely peeled off from the backing film 16, which exerts no excessive load on IC carrier 11. Since the tackiness of adhesive layer 16 on the backing film 16 is weak, little adhesive remains on the back surface of IC carrier 11. Further, no projection remains on the peripheral edge of IC carrier 11, a difference from the conventional case, and therefore the IC carrier 11 can be positively set in the mount portion in the selected device.

The embodiment of the present invention was described above. It should, however, be noted that the present invention is not intended to be limited to the above embodiment, but may have various modifications within the range not departing from the essence thereof.

The above embodiment was so arranged that the shape of IC carrier 11 was approximately similar to the shape of aperture 13a, but their shapes do not necessarily have to be approximately similar to each other. Depending upon the shape of a cutting tool used in the spot-facing machine or the shape of a trimming die used in the blanking machine, the aperture 13a may be formed in any shape, for example, in a rectangular shape, as long as the IC module 12 is located at the position compliant with ISO.

According to the present invention, the IC module is produced in the same shape and same size as IC carrier in a different flow from that of the sheet frame, which can obviate the spot-facing step for mount of IC module on the card base and the inspection step after that, reducing the production cost. Further, the sheet frame may be made of a cheap material, reducing the cost of material for sheet frame.

Eighth Embodiment

Figure 33A:
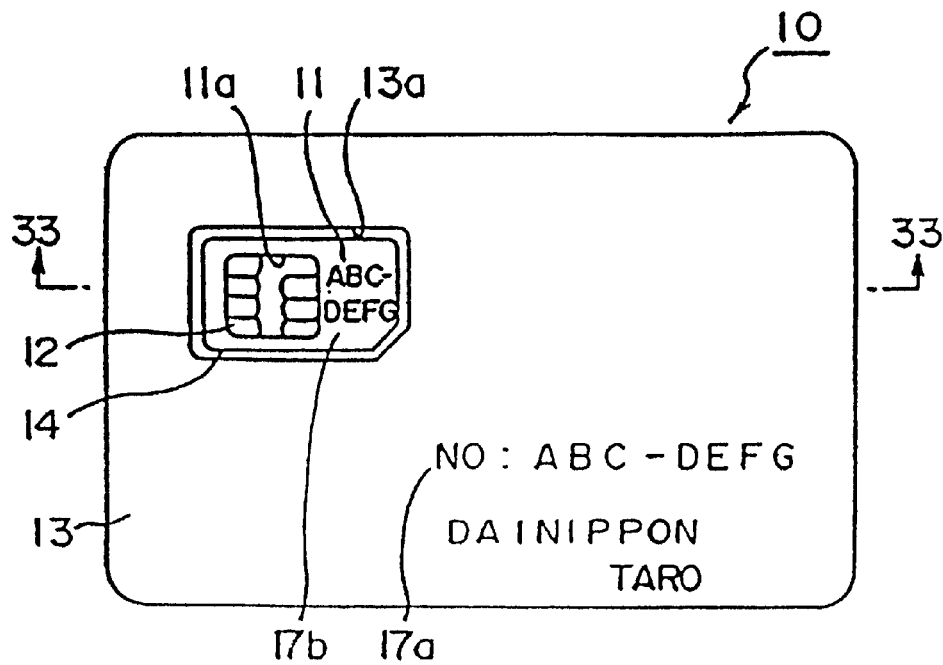
FIGS. 33A and 33B are drawings to show a sheet-framed IC carrier as an eighth embodiment of the present invention.
Figure 33B:
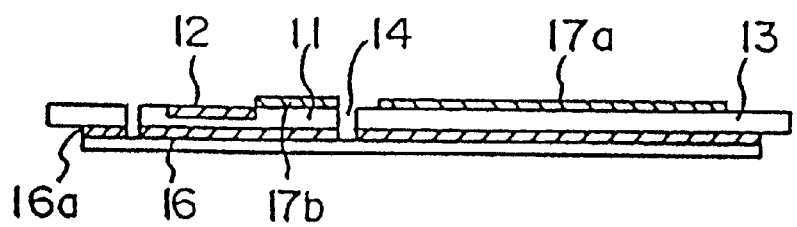
Figure 34:
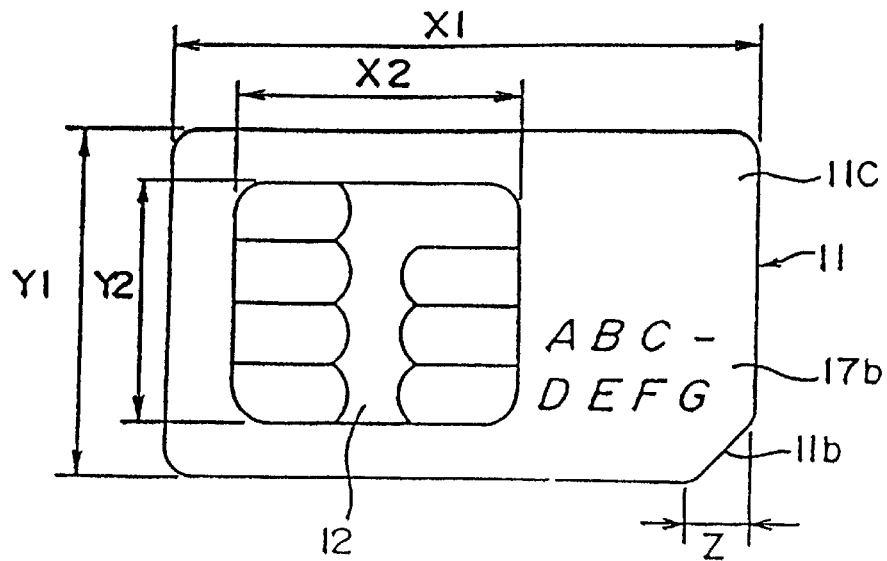
FIG. 34 is a drawing to show an IC carrier in the eighth embodiment.

The eighth embodiment of the present invention will be described referring to the drawings. FIGS. 33A and 33B are drawings to show an embodiment of the sheet-framed IC carrier according to the present invention. FIG. 33A is a plan view and FIG. 33B a cross section along line 33—33 of FIG. 33A. FIG. 34 is a drawing to show an IC carrier. In the present embodiment a sheet-framed IC carrier 10 is mainly composed of an IC carrier 11, a sheet frame 13, and a backing film 16.

The sheet frame 13 is a resin sheet, for example, of polyvinyl chloride, which has an aperture formed in a partial region. An information indicating layer 17a is provided on the sheet frame 13, indicating a serial number as individual identification information of IC carrier 11.

The backing film 16 has a pressure-sensitive adhesive layer 16a put on one surface thereof, through which the backing film 16 is stuck on the back surface of sheet frame 13, covering the back side of aperture 13a. The backing film 16 has a size, preferably, same as or a little (about 2 mm) smaller than the outer shape of sheet frame 13. The thickness of backing film 16 is in the range of 80 to 200 $\mu$m, preferably about 100 $\mu$m. The thickness of adhesive layer 16a is preferably in the range of about 20 to 23 $\mu$m. Such thickness ranges assure the strength sufficient to secure IC carrier 10.

An IC carrier 11 having an IC module 12 is fit in the aperture 13a in the sheet frame 13, where the IC carrier 11 is secured on the back surface with the adhesive layer 16a on the backing film 16. A frame slit 14 is provided at an appropriate gap between the aperture 13a and the IC carrier 11. The adhesive layer 16a has such weak tackiness that it loses the tackiness once peeled off after the IC carrier 11 is first stuck thereon.

The IC carrier 11 is so arranged, as shown in FIG. 34, that an IC module 12 sized in the height Y2 of about 10.6 mm by the width X2 of about 12.0 mm is mounted on a resin base 11c sized in the height Y1 of about 15.00 mm by the width X1 of about 25.00 mm and that a cut 11b of about 3.00 mm is formed at a corner as Z for positioning in mounting the IC module in a selected device. Further, an information indicating layer 17b is provided on the base 11c, indicating the above serial number of IC carrier 11.

Figure 35:
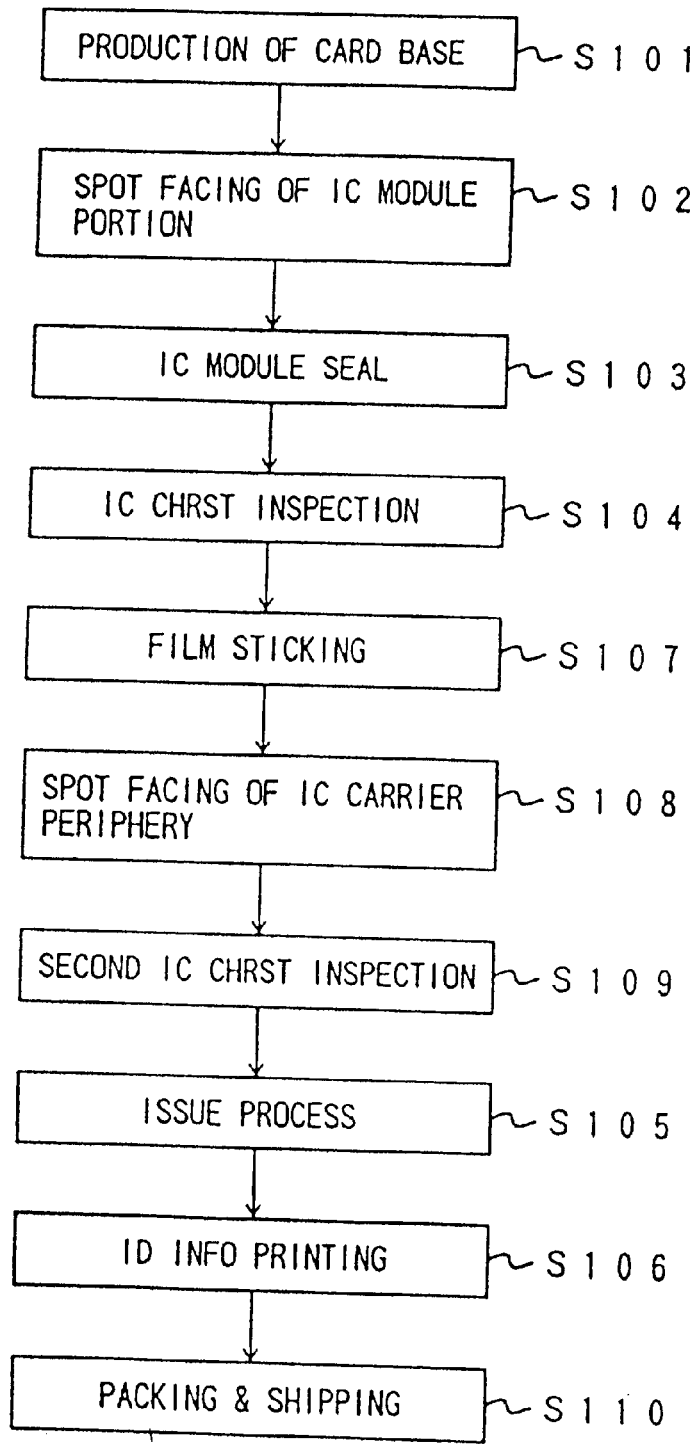
FIG. 35 is a process drawing to show a method for producing the sheet-framed IC carrier according to the present invention.

A method for producing the sheet-framed IC carrier is next described. FIG. 35 is a process diagram to show an embodiment of the method for producing the sheet-framed IC carrier according to the present invention.

In FIG. 35, a card base is first produced according to the ordinary plastic card production method (step 101) and a mount recess 11a for IC module 12 to be mounted therein is formed in the card base, using a spot-facing machine (step 102). The IC module 12 is then set through a thermosetting adhesive in the mount recess 11a and a module seal step is carried out to press the IC module 12 on a hot plate (step 103). An inspection step is next carried out to inspect characteristics or performance of IC (step 104).

The backing film 16 is next put on the back surface of the card base (step 107). After that, using the spot-facing machine, a frame slit 14 is formed by cutting and removing a portion of the card base outside corresponding to the peripheral edge of IC carrier 11, leaving the backing film 16 (step 108). Here, the cutting process may be such that only the card base is cut, such that the adhesive layer 16a on the backing film 16 is also cut, or such that even a part of the backing film 16 is also cut without completely cutting through the backing film 16.

Then a secondary IC inspection step is carried out to inspect characteristics or performance of IC after the cutting/ removing step (step 109). This step can be omitted if the above step 108 causes no damage on IC module 12.

An issue step is next performed to write information concerning a subscriber of SIM in the IC module 12 (step 105).

Next, a serial number as identification information of individual card is printed on the sheet frame 13 and on the base 11c of the IC carrier 11 by an ink jet printer or the like (step 106). This process forms the information indicating layers 17a, 17b on the card base.

After that, the sheet-framed IC carrier 10 is set in a slit mount, and enclosed and sealed in an envelope, performing a packing and shipping step (step 110).

A user receiving the sheet-framed IC carrier 10 peels off the IC carrier 11 from the sheet frame 13 and mounts it in a selected device.

If the IC carrier 11 is lost or stolen, the user can inform the issuing agency of the serial number of IC carrier 11 indicated on the sheet frame 13 without IC carrier 11. If the IC carrier 11 is broken, the user may inform the issuing agency of the serial number indicated on the base 11c of IC carrier 11 or on the sheet frame 13. In this case, the user can inform the issuing agency of his or her serial number even if he or she has lost the sheet frame 13.

Then, the issuing agency can immediately specify the user among a lot of users, using the serial number, and can efficiently proceed with an invalidating process of the IC carrier 11 and a reissuing process of IC carrier 11.

The embodiment of the present invention was described above. It should, however, be noted that the present invention is not intended to be limited to the above embodiment, but may have various modifications within the range not departing from the essence thereof.

For example, the information indicating layers 17a, 17b do not necessarily have to be formed after the mounting of IC module 12, but may be formed at the same time as the production of the card base. Accordingly, the information indicating layers 17a, 17b may be formed not only by the ink jet printer, but also by a laser printer (laser printing), offset printing, screen printing, sublimation transfer printing, or engraving.

The identification information of individual card was the serial number in the above example, but the information may be any information, for example a registration number of a user, as long as it is information by which the user can be specified.

The identification information indicated by the information indicating layer 17a does not necessarily have to be coincident with that indicated by the information indicating layer 17b.

Further, the identification information may be a bar code or magnetic information which can be mechanically read, or a combination thereof with the serial number.

According to the present invention, the identification information is indicated on the sheet frame and the base portion of IC carrier, whereby the user can inform the issuing agent of the identification information when the IC carrier is broken or lost. Then the issuing agent can immediately specify the IC carrier. This permits the issuing agency to efficiently reissue another IC carrier. In case a plurality of IC carriers are mixed with each other, each IC carrier can be identified by its appearance, which can obviate a need to check the identification information through a reading apparatus.

Ninth Embodiment

Figure 36A:
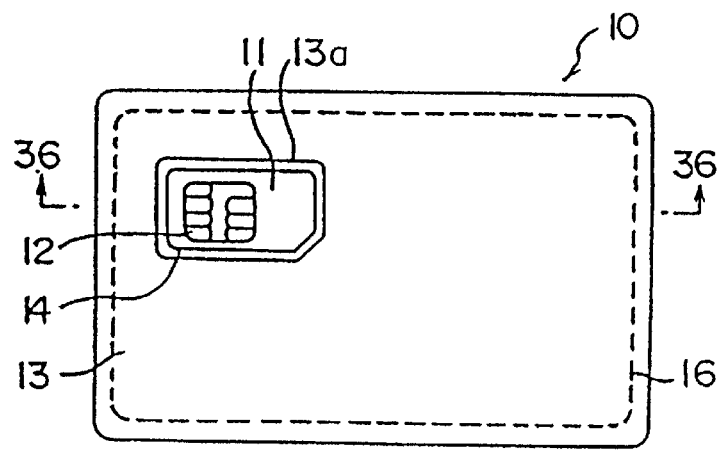
FIGS. 36A and 36B are drawings to show a sheet-framed IC carrier as a ninth embodiment of the present invention.
Figure 36B:
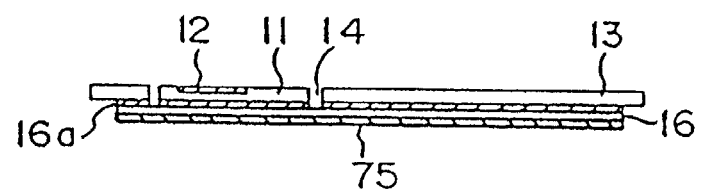

The ninth embodiment of the present invention will be described referring to the drawings. FIGS. 36A and 36B are drawings to show a sheet-framed IC carrier according to the present invention. FIG. 36A is a plan view and FIG. 36B a cross section along line 36—36 in FIG. 36A. Further, FIG. 37 is a drawing to show an IC carrier. In the present embodiment, a sheet-framed IC carrier 10 is mainly composed of an IC carrier 11, a sheet frame 13, and a film 16.

The sheet frame 13 is made of a material selected from paper materials such as wood free paper, coat paper and resin-impregnated paper; plastic sheets of resins such as polyvinyl chloride (PVC), polyethylene terephthalate (PET), polyvinyl chloride-acetate copolymer (PVCA), polystyrene (PS), and acrylonitrile-butadiene-styrene copolymer (ABS); laminates thereof. The thickness of sheet frame 13 is in the range of about 150 to 800 $\mu$m. An aperture 13a is formed in a partial region of sheet frame 13.

The film 16 is made of polyester, for example, in the thickness of about 75 $\mu$m. The film 16 has a pressure-sensitive adhesive layer 16a on one surface and a magnetic layer 75 on the other surface.

The pressure-sensitive adhesive layer 16a is made, for example, of an acrylic pressure-sensitive adhesive material in the thickness of about 20 $\mu$m.

The magnetic layer 75 is a magnetic information recording layer in which information can be mechanically written and from which the recorded information can be mechanically read. The magnetic information recording layer (magnetic layer 75) is formed, for example, by (1) the gravure process, the doctor blade process, or the reverse roll method, which is a method for directly applying a magnetic coating onto film 16, or (2) a transfer method in which a release agent, a magnetic coating, and a heat-sensitive adhesive are successively laminated on a PET film with thickness of about 20 $\mu$m to produce a transfer film, and the transfer film is heated while urged against the film 16 to transfer the laminated materials to form the magnetic layer.

A magnetic material for the magnetic layer 75 has characteristics compliant with ISO standards and JIS standards, specifically the coercive force $H_c$ of 290 [Oe], the residual flux density $\Phi_r$ of 1.30 [Maxwell/cm], and the rectangularity ratio $\delta$ of 0.8, for example.

The film 16 is stuck on one surface of sheet frame 13 through the tackiness of the pressure-sensitive adhesive layer 16a, covering an aperture 13a. The magnetic layer 75 is thus provided on one surface of the sheet-framed IC carrier 10.

An IC carrier 11 having an IC module 12 is fit in the aperture 13a in the sheet frame 13, where it is secured with the adhesive layer 16a on the film 16. A peripheral slit 14 is thus provided at an appropriate gap between aperture 13a and IC carrier 11. The adhesive layer 16a has such weak tackiness that it loses the tackiness once peeled off after first adhesion of IC carrier 11. Terminals of IC module 12 are located at positions compliant with ISO standard with respect to the sheet frame 13.

The IC carrier 11 is so arranged, as shown in FIG. 37, that an IC module 12 sized in the height Y2 of about 10.6 mm by the width X2 of about 12.0 mm is mounted on a resin base sized in the height Y1 of about 15.00 mm by the width X1 of about 25.00 mm and that a cut 11b of about 3.00 mm is formed at a corner as Z for positioning the module in mounting it in a selected device.

FIG. 38 and FIG. 39 are drawings to show first and second embodiments of magnetic layer 75, showing the opposite side of sheet-framed IC carrier 10 to FIG. 36A. In FIG. 38 and FIG. 39, the IC carrier 11 is drawn by solid lines in order to clarify the positional relation between magnetic layer 75 and IC carrier 11.

In FIG. 38, the magnetic layer 75 is a so-called magnetic stripe formed in a stripe on film 16. Further, the magnetic layer 75 is located at a position compliant with ISO standards, i.e., at a predetermined distance to the upper edge of sheet frame 13 in the drawing. Accordingly, the information recorded in the magnetic layer 75 can be read by a magnetic reader compliant with ISO standard. The above-described transfer method is suitable for forming the magnetic layer 75 of magnetic stripe.

In FIG. 39, the magnetic layer 75 is formed almost all over the film 16. This formation is easy in positioning the film 16 when stuck on the sheet frame.

Here, the magnetic layer 75 may be formed after the film 16 is put on the card base, or, preliminarily forming the magnetic layer 75 on the film 16, the film 16 cut (blanked) in the size not exceeding the card base 13 may be put onto the card base. Before the card base is blanked in a predetermined shape, the film 16 may be put on the card base and the card base with film 16 adhering thereto may be blanked in a predetermined shape.

In the above arrangement where the magnetic layer 75 is provided on the surface of film 16, information can be written in the magnetic layer 75 and the written information can be read even after the film 16 is stuck on the card base.

A method for producing the sheet-framed IC carrier is next described.

A card base is first produced according to the ordinary plastic card production method and a recess for IC module 12 to be mounted therein is formed in the card base, using a spot-facing machine. An IC module 12 is then set in the recess through a thermosetting adhesive and is pressed on a hot plate to effect module seal. By this, the IC module 12 is mounted on the card base (IC module mounting step).

Then a film 16 is put on one surface of card base 13 (which is a surface opposite to the mount surface of IC module 12) (film sticking step). Subsequently, an inspection step is performed to inspect characteristics or performance of IC. After that, a peripheral slit 14 is formed by cutting and removing the card base outside a portion corresponding to the peripheral edge of the IC carrier 11 in the form of a groove, leaving the film 16 (IC carrier forming step). Here, the cutting process may be such that only the card base 13 is cut, such that the adhesive layer 16a on film 16 is also cut, or such that even a part of film 16 is also cut without completely cutting through the film 16 or the magnetic layer 75.

Then a secondary IC inspection step is carried out to inspect characteristics or performance of IC after the cutting and removing process. This step can be omitted if the above IC carrier forming step causes no damage on IC module 12.

Then identification information concerning a subscriber of SIM is written in IC module 12 in accordance with the purpose of IC carrier 11 (information recording step). Incidentally, prior to this step, the information concerning the subscriber of SIM has been written in the magnetic layer 75. Accordingly, after the identification information written in the magnetic layer 75 is first read, the identification information can be written in IC module 12, based on the read identification information. Namely, the matching process of information can be executed using a matching inserter or the like, enhancing the production efficiency.

After that, the sheet-framed IC carrier 10 is set in a slit mount, and enclosed and sealed in an envelope, performing a packing and shipping step. As described above, the above method employs the conventional IC card production facilities, which can easily perform the various inspection steps and the packing and shipping step including the enclosing operation into the envelope, difficult with an IC carrier 11 alone, and which can assure sufficient machining accuracy.

The embodiments of the present invention were described above. It should, however, be noted that the present invention is not intended to be limited to the above embodiments, but may have various modifications within the range not departing from the essence thereof.

For example, in order to improve the durability of magnetic layer 75, an overprint layer (protection layer) may be provided in the thickness of about 1 to 3 μm on the magnetic layer 75. Further, an anchor layer may be provided between film 16 and magnetic layer 75 in order to improve adhesion between them.

According to the present invention, the information can be written in the magnetic layer or read therefrom after the film is stuck on the base, so that the matching process can be done in production by reading the identification information in the magnetic layer and recording the identification information in the IC module, based on the identification information. This can enhance the production efficiency and prevent error record of information.

Tenth Embodiment

Figure 41:
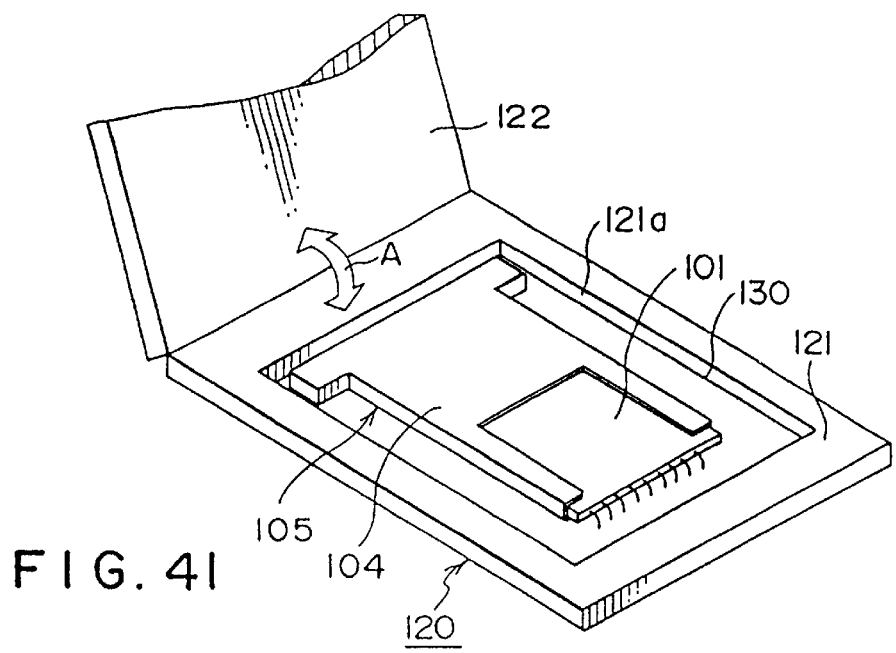
FIG. 41 is a perspective view to show an embodiment in which an IC carrier with holder is stored in the IC carrier case of FIG. 40.

The tenth embodiment of the present invention will be described referring to the drawings. FIG. 40 and FIG. 41 are perspective drawings to show the structure of an IC carrier case according to the present invention. In FIG. 40, an IC carrier case 120 is composed of a case body 121 and a cover 122 attached to the case body 121.

The case body 121 and cover 122 are made, for example, of a resin material, which are preferably light and thin. A storage space 121a is formed in the upper surface of case body 121. The storage space 121a can be integrally molded with case body 121 or be formed by cutting (spot-facing) the case body 121 after molded. The storage space 121a is so formed that the profile of an opening region 130 on the upper surface is, for example, several millimeters larger than the outer shape (profile) of IC carrier 101. The depth of storage space 121a is preferably nearly equal to the thickness of IC carrier 101, but may be a little deeper or shallower than it.

The cover 122 is attached to the case body 121 as pivotable in the directions of A in FIG. 40 and in FIG. 41. The cover 122 is arranged to fit to the upper surface of case body 121. In the fit condition, the cover 122 is arranged to cover at least the opening region 130 of storage space 121a.

The IC carrier 101 is stored in the storage space 121a when not used, e.g., when carried, and the cover 122 covers the IC carrier 101. When used, the IC carrier 101 is taken out of the IC carrier case 120.

FIG. 41 shows an embodiment where an IC carrier 101 set in socket 104 (socketed IC carrier 105) is stored in the IC carrier case 120 of FIG. 40. Accordingly, the profile of the opening region 130 on the upper surface of storage space 121a is formed several millimeters larger than the outer shape (profile) of the socketed IC carrier 105. The opening region 130 of storage space 121a may be formed in the shape similar to the outer shape of socketed IC carrier 105.

Figure 42:
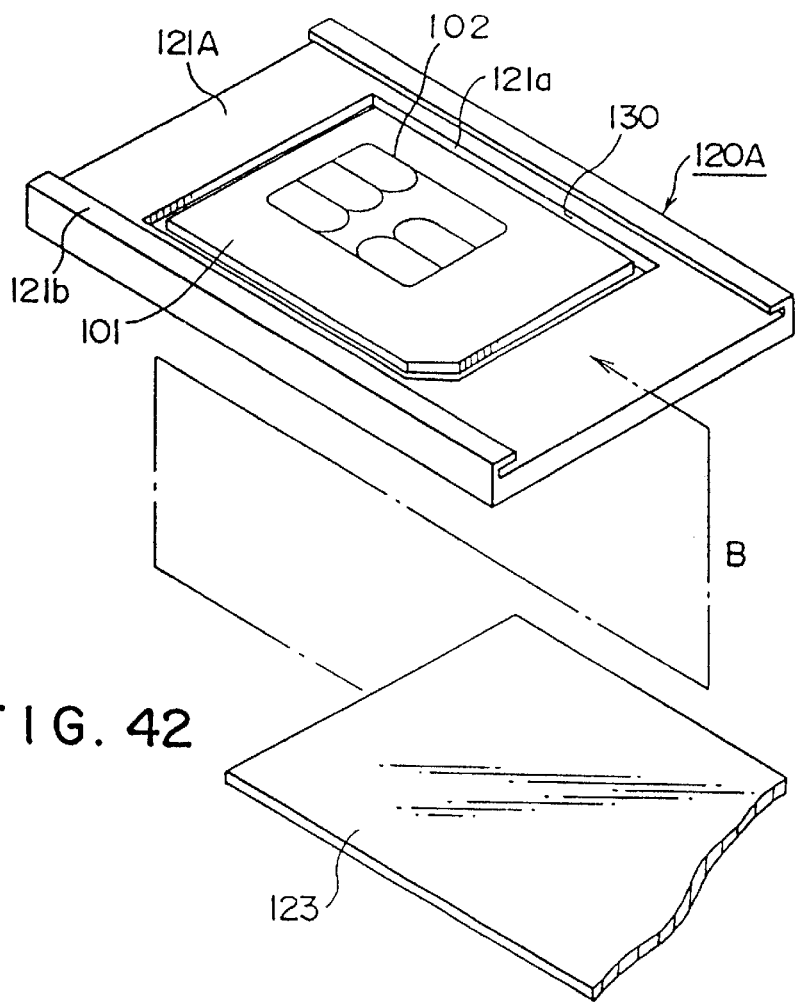
FIG. 42 is a perspective view to show a modification of the IC carrier case according to the present invention.

FIG. 42 is a perspective view to show another embodiment of the IC carrier case according to the present invention. A storage space 121a is formed in a case body 121A of the IC carrier case 120A. Supports 121b projecting in the reversed-L-shape are provided at the longitudinal peripheral edges (upper and lower edges in the drawing) on the upper surface of case body 121A. The cover 123 is a plate, which can be mounted or dismounted with respect to the case body 121A. The cover 123 is slid in the direction B as shown in FIG. 42 to be set on the upper surface of case body 121A. In this condition, the cover 123 covers at least the opening region 130 above the upper surface of storage space 121a while engaging with the supports 121b.

Figure 43:
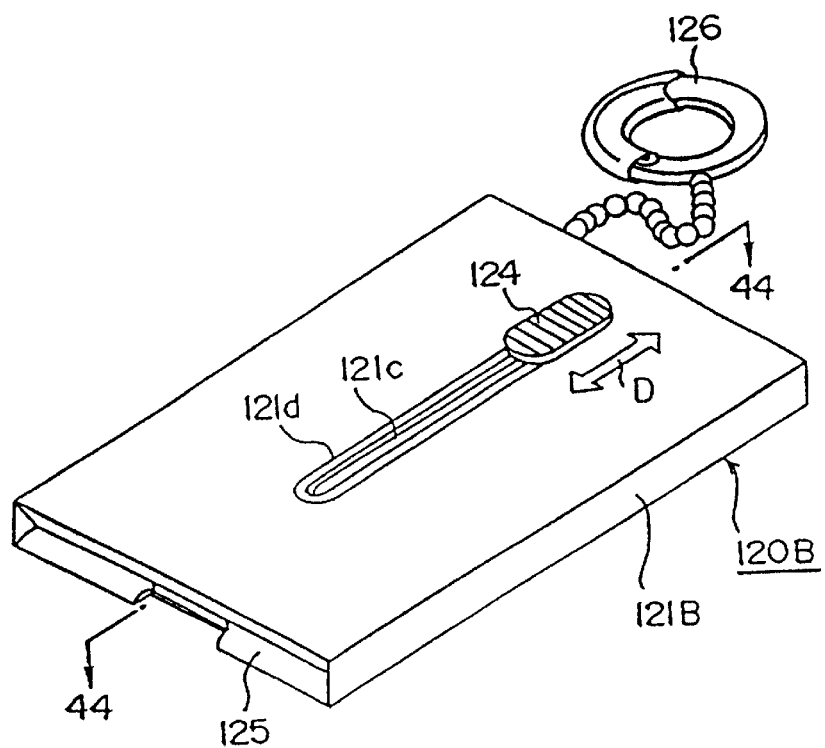
FIG. 43 is a perspective view to show a modification of the IC carrier case according to the present invention.
Figure 44:
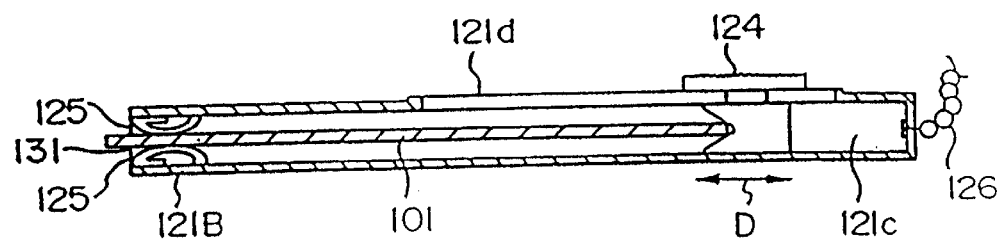
FIG. 44 is a cross section to show the IC carrier case of FIG. 43.

FIG. 43 is a perspective view to show another embodiment of the IC carrier case according to the present invention, and FIG. 44 is a cross section along line 44—44 in FIG. 43. A case body 121B of IC carrier case 120B is formed in a nearly C-shaped cross section. The case body 121B has a storage space 121c opening as a slot 131 on the side surface at the left end in FIG. 44. Further, a slit 121d is formed in the upper surface of case body 121B so that it opens along the directions D in FIG. 44, which are directions for mounting or dismounting the IC carrier 101.

A slider 124 is set outside the upper surface of case body 121B as engaging with the slit 121d from inside the storage space 121c. Supports 125 are formed of elastic members, for example, plate springs in a nearly arcuate cross section. The supports 125 are attached to upper surface and lower surface near the aperture of storage space 121c inside the case body 121B. Accordingly, the IC carrier 101 is held by the elastic force of supports 125 when stored in the storage space 121c. The elastic members for supports 125 are members unlikely to give an external damage or external stress, for example a scratch, on IC module 102 (surface of external contact terminal) in IC carrier 101.

As the slider 124 is slid in the direction D in FIG. 44, it comes into contact with the IC carrier 101 stored in the storage space 121c at the portion of slider 124 in the storage space 121c, and pushes out it through between the supports 125. Thus sliding the slider 124, the user can mount the IC carrier 101 into a selected device without directly touching the IC carrier 101.

A holder 126 may be provided on the IC carrier case 120B (120, 120A) with necessity, as shown in FIG. 43.

The embodiments of the present invention were described above. It should, however, be noted that the present invention is not intended to be limited to the above embodiments, but may have various modifications within the range not departing from the essence thereof. For example, the IC carrier cases 120A, 120B are the examples for storing the IC carrier 101, but may be modified for storing a socketed IC carrier 105.

The edges of case body 121, 121A, 121B may be chamfered or rounded.

Figure 45:
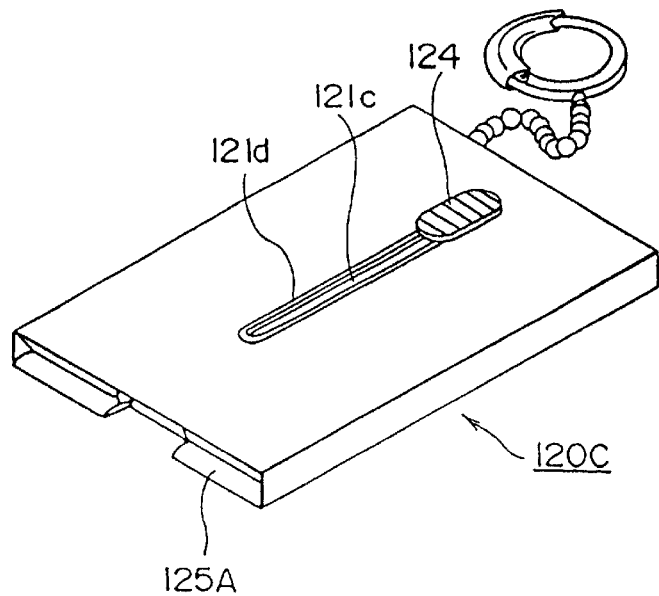
FIG. 45 is a perspective view to show another modification of the IC carrier case o f FIG. 43.

FIG. 45 is a perspective view to show a modification of IC carrier case 120B of FIG. 43. The IC carrier case 120C has supports 125A corresponding to the supports 125 of IC carrier case 120B. The supports 125A are arranged not to contact with the IC module 102 in IC carrier 101 but to support the peripheral portions of IC carrier 101. This arrangement can prevent a stress from being applied on IC module 102.

Figure 46:
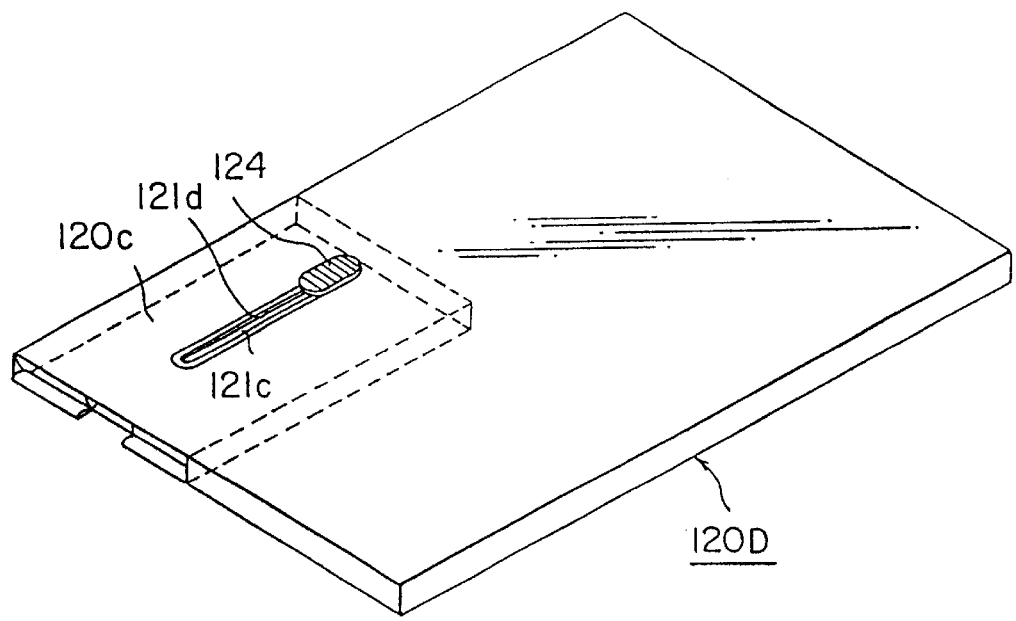
FIG. 46 is a perspective view to show another modification of the IC carrier case of FIG. 45.

FIG. 46 is a perspective view to show a modification of IC carrier case 120C of FIG. 45. The outer shape of IC carrier case 120D is approximately the same as the outer shape of ordinary IC cards, and the above-described IC carrier case 120C is formed as a part of IC carrier case 120D. This arrangement can enhance the portability.

Effect of the Embodiments

According to the present invention, the IC carrier is protected as stored in a purpose-built case when not used, where no external load is exerted on the IC carrier while carried, thus preventing a damage on IC carrier. Further, this arrangement can lower the possibility of losing the IC carrier. Since the cover covers the upper surface, the terminals of IC module can be prevented from being broken. Further, the IC carrier can be set in a selected device without directly touching the IC carrier, which can prevent the terminals of IC carrier from being contaminated, thus preventing poor connection of terminals with the selected device.

As described above, the present invention is characterized in that the IC carrier is secured in a sheet frame through a backing film, which can prevent an excessive force from being exerted on IC module when it is removed.

Further, the present invention is characterized in that the IC carrier can be stored in a case body of IC carrier case, where no external load is applied on the IC carrier when it is not used, e.g., when it is carried, preventing a damage on IC carrier.

Further, the present invention permits the conventional IC card production facilities to be used without modification to produce sheet-framed IC carriers, effectively using the facilities and reducing the production cost.

What is claimed is:

1. A method for producing a sheet-framed IC carrier in which an IC carrier having an IC module is secured with a pressure-sensitive adhesive layer on a backing film in an aperture in a sheet frame, comprising:

mounting an IC module on a sheet card base;

adhering a backing film having a pressure-sensitive adhesive layer on one surface thereof onto a back surface of said card base; and cutting and removing a portion corresponding to a peripheral edge of said IC carrier on a top surface of said card base, excluding said backing film, to form a peripheral slit, whereby the sheet frame and the IC carrier secured in the aperture are separated from each other through the peripheral slit.

2. The method for producing a sheet-framed IC carrier according to claim 1, wherein in the step of forming the peripheral slit, a bridge portion is formed connecting the IC carrier and the sheet frame.

3. The method for producing a sheet-framed IC carrier according to claim 1, further comprising a step of cutting and removing a region between the peripheral slit and a peripheral edge portion of the card base on the top surface of the card base, leaving the backing film, to form a frame slit, whereby the sheet frame may be divided through the frame slit into two or more frame segments.

4. The method for producing a sheet-framed IC carrier according to claim 3, wherein the step of forming the frame slit, a bridge portion is to connect between the frame segments.

5. The method for producing a sheet-framed IC carrier according to claim 1, further comprising a step of cutting and removing a region outside a region covering the aperture of the backing film, leaving the sheet frame, to form a film slit.

6. The method for producing a sheet-framed IC carrier according to claim 1, further comprising a step of providing an information indicating portion for indicating identification information of said IC carrier, in portions corresponding to the sheet frame and the IC carrier on the card base.

7. The method for producing a sheet-framed IC carrier according to claim 1, wherein said backing film has a magnetic layer for information to be written or read, on the other surface, further comprising a step of recording mutually related information in the magnetic layer and in the IC module.

8. A method for producing a sheet-framed IC carrier in which an IC carrier having an IC module is secured with a pressure-sensitive adhesive layer on a backing film in an aperture in a sheet frame, comprising:

forming an aperture in a card base;

adhering a backing film having a pressure-sensitive adhesive layer on one surface thereof, onto a back surface of said card base;

cutting and removing a region between said aperture and a peripheral edge portion of said card base, leaving the backing film, to form a frame slit, whereby the sheet frame may be separated through the frame slit into two or more frame segments; and securing said IC carrier in said aperture with said adhesive layer on said backing film.

9. The method for producing a sheet-framed IC carrier according to claim 8, wherein the step of forming the frame slit, a bridge portion is provided to connect the frame segments.

10. The method for producing a sheet-framed IC carrier according to claim 8, further comprising a step of cutting and removing a region outside a region covering the aperture of the backing film, leaving the sheet frame, to form a film slit.

11. A method for producing a sheet-framed IC carrier in which an IC carrier having an IC module is secured with a pressure-sensitive adhesive layer on a backing film in an aperture in a sheet frame, comprising:

adhering a backing film having a pressure-sensitive adhesive layer on one surface thereof, onto a back surface of a card base;

forming a mount recess for mounting an IC module therein on a top surface of the card base and cutting and removing a portion corresponding to a peripheral edge of said IC carrier, leaving the backing film, to form a peripheral slit portion; and mounting an IC module in said mount recess.

12. The method for producing a sheet-framed IC carrier according to claim 11, wherein in the step of forming said mount recess and peripheral slit, a frame slit is formed by cutting and removing a region between the peripheral slit and the peripheral edge portion of the card base, leaving the backing film, so that said sheet frame may be separated into two or more frame segments.

13. The method for producing a sheet-framed IC carrier according to claim 12, wherein the step of forming the frame slit, a bridge portion is provided to connect the frame segments.

* * * * *